(12) United States Patent
Brennan et al.

(10) Patent No.: US 7,713,875 B2
(45) Date of Patent: May 11, 2010

(54) VARIABLE SALICIDE BLOCK FOR RESISTANCE EQUALIZATION IN AN ARRAY

(75) Inventors: Michael Brennan, Stouffville (CA); Yi He, Fremont, CA (US); Mark Randolph, San Jose, CA (US); Ming-Sang Kwan, San Leandro, CA (US)

(73) Assignee: Spansion LLC, Sunnyvale, CA (US)

( * ) Notice: Subject to any disclaimer, the term of this patent is extended or adjusted under 35 U.S.C. 154(b) by 442 days.

(21) Appl. No.: 11/748,215

(22) Filed: May 14, 2007

(65) Prior Publication Data

US 2008/0150007 A1 Jun. 26, 2008

Related U.S. Application Data

(60) Provisional application No. 60/875,905, filed on Dec. 20, 2006.

(51) Int. Cl.
*H01L 21/44* (2006.01)
(52) U.S. Cl. .................. 438/682; 257/413; 257/755; 257/E21.438; 257/E21.659; 438/655

(58) Field of Classification Search ................. 438/281, 438/299, 599, 655, 682; 257/413, 755, E29.156, 257/E21.593, E21.636, E21.659
See application file for complete search history.

*Primary Examiner*—David Vu
*Assistant Examiner*—Earl N Taylor
(74) *Attorney, Agent, or Firm*—Eschweller & Associates, LLC

(57) ABSTRACT

The present invention facilitates memory devices and operation of dual bit and single bit memory devices by providing systems and methods that employ a salicide block to vary and equalize the resistance of a memory array during fabrication. The present invention includes utilizing a common charge dissipation region to mitigate charge-loss by providing protection against charging up of the various lines as a result of further plasma etching processes. The salicide block equalizes the charge dissipation in the memory array by providing each wordline path with a varied amount of resistance in addition to the total path resistance. Because the charge protection provided to each wordline otherwise varies depending on the resistance path to a common discharge element, a salicide block for resistance equalization provides greater reliability and predictability during processing. Other such shapes conducive for any desired resistance path fall within the scope of the invention.

16 Claims, 18 Drawing Sheets

VARIABLE SALICIDE BLOCK FOR RESISTANCE EQUALIZATION IN AN ARRAY

REFERENCE TO RELATED APPLICATIONS

This application claims the benefit of U.S. Provisional Patent Application Ser. No. 60/875,905 which was filed Dec. 20, 2006, entitled "VARIABLE SALICIDE BLOCK FOR RESISTANCE EQUALIZATION IN AN ARRAY."

FIELD OF INVENTION

The present invention relates generally to memory devices and the like, and in particular to fabricating dual bit and single bit memory devices with improved reliability to a commonly joined element by a variable salicide block equilibrating the resistance in an array.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc., as well as in many larger electronic systems, such as cars, planes, industrial control systems, etc.

Flash memory is generally constructed of many memory cells where single bits of data are stored in and read from respective memory cells. The cells are generally programmed by hot electron injection and erased by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell, respectively. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

A traditional stacked gate memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR architecture configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined voltage potential above the source. which causes hot electrons to be injected from the drain depletion region into the floating gate. Upon removal of the programming voltages, the injected electrons are trapped in the floating gate and create a negative charge therein which increases the threshold voltage of the cell.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region. The electrons are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.1 and 2.0 volts in a read operation. A voltage is then applied to the gate (e.g., the wordline) of the memory cell transistor in order to cause a current to flow from the drain to source. The read operation gate voltage is typically applied at a level between a programmed threshold voltage (VT) and an unprogrammed threshold voltage. The resulting current is measured, by which a determination is made as to the data value stored in the cell.

A modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the addressing of the two bits.

In a virtual ground type architecture, dual bit memory cells have a semiconductor substrate with implanted conductive bitlines (columns) formed therein. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Wordlines and bitlines are isolated from each other by forming an interlayer dielectric layer over the wordlines and bitlines. Contacts are formed in the interlayer dielectric layer to connect to the wordlines and bitlines to allow operation of the memory device. The contacts provide an external connection to the device. Charge loss is a loss of charge for memory cells over time that can cause a cell initially in one charge state to move to a different charge state. Contact resistance is resistance at an interface between a formed contact and a wordline or bitline and can lead to undesired voltage drops across the interface that negatively impact programming, erasing, and reading of the memory device.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto individual semiconductor wafers (or die).

One technique utilized to pack more memory cells/transistors into a smaller area is to form their structures and component elements closer together. Forming bitlines closer together, for example, shortens the length of a channel defined there-between and allows more devices to be formed in the same area. This can, however, cause certain phenomena to become more prevalent and have a substantial impact on device performance. For example, Vt roll-off may become more pronounced as respective channel lengths are decreased. In particular, a threshold voltage (Vt), or voltage at which a transistor or memory cell "turns on" or becomes active to store and/or erase a bit of data (e.g., a charge), may vary (e.g., become reduced) as the respective channel length is decreased (e.g., source and drain regions are brought closer together). Additionally, the severity of Vt roll-off may vary among different memory cells. In this manner, not all of a selected group of memory cells may be programmed/erased when the same or a similar voltage is applied to the cells. This could result in corrupt data and/or inaccurately stored or programmed data.

Similarly, other issues, such as leakage currents, cross talk, etc., can also result from scaling. For example, isolating two bits or charges stored in a charge trapping layer becomes increasingly difficult as the channel length is decreased and the bits are brought closer together. In this manner, cross-talk can occur, the bits can contaminate one another and operations performed on one bit can affect the other bit (sometimes referred to complimentary bit disturb or CBD). Accordingly, it would be desirable to reduce feature sized so as to increase packing density while mitigating the adverse affects that may result therefrom, such as Vt roll-off and CBD.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One aspect of the present invention facilitates memory devices and operation of dual bit and single bit memory devices by providing systems and methods that can employ a non-symmetrical salicide block, for example, for resistance equalization of the memory array during fabrication. Employment of the salicide block facilitates dual bit and single bit memory device operation by mitigating charge-loss and contact resistance while providing protection against charge-up on the various lines from plasma etching processes. One example of the present invention includes utilizing a silicon rich nitride layer formed on a plurality of wordlines.

A further aspect of the present invention can utilize a common charge dissipation element to mitigate charge-loss by providing protection against charging up of the various lines as a result of further plasma etching processes. Alternatively, a common charge dissipation element provides a region of charge dissipation away from the memory array to prevent charge-up of the memory cell during processing or various etches.

Another aspect of the present invention utilizes a triangular wedge shaped salicide region for purposes of controlling the resistance of each wordline of an array to a common shorting element of a common discharge element. The salicide block equalizes the charge dissipation in the memory array by providing each wordline with a varied amount of resistance. Because the charge protection provided to each wordline varies depending on the total resistance path to a common discharge element, a varying shape salicide block for resistance equalization provides greater reliability and predictability during processing. Numerous such shapes, conducive for any desired resistance path fall within the scope of the invention, for example oval, trapezoidal, and the like. Any shape of the salicide block may be utilized by varying the measured angle or shape of etching on each wordline or calculated so that the resistance matches each wordline path to a common element.

Yet another aspect of the present invention involves a dual poly bit process whereby poly transverses bitlines to form wordlines connected to a common discharge element or a common charge dissipation element. One example of a possible common charge dissipation element comprises a polysilicon layer above a gate oxide to form a common element capacitor. One embodiment of the common element can reside above a semiconductor substrate with a gate oxide layer above the semiconductor substrate with a thickness of about 30 Angstroms. Other methods may be utilized for formation of a common element including but not limited to forming wells and other implants performed for the purposes of a common element.

Still yet another aspect of the present invention and only one embodiment of various arrangements within the scope of the invention is a bow-tie shaped arrangement of more than one variable salicide block within an array. Each sector of typically 256 wordlines in a memory array contains typically two common charge dissipation elements, one element for a top portion of a plurality of wordlines in a sector and another for a bottom portion of a plurality of wordlines in a sector. Each common charge dissipation element dissipates any charge-up on a plurality of wordlines or a plurality of bitlines in an array during a variety of processes or various etchings. Alongside each common shorting element and overlying wordlines connecting the common shorting elements of the common dissipation elements is a salicide block shaped for various resistance paths. The top salicide block of the array is a downward triangular shape tapering inward to the center and bottom salicide block of an array is an upward triangular shape tapering inward to the center in a bow-tie formation. One embodiment of the present invention includes a salicide block that is a wedge or a triangular shape. Other shapes conducive for any desired resistance path fall within the scope of the invention. Any shape of the salicide block may be utilized by varying the measured angle of etching on each wordline or calculated so that the resistance matches each wordline path to a common element.

Yet another aspect of the present invention comprises one or more common shorting paths connecting a plurality of wordlines to one or more discharge elements of a sector of an array. One example is a sector of an array being symmetrically aligned so that a common discharge element of a common shorting path is placed on each side of a shared plurality of wordlines, thereby facilitating charged line bleed-off from each end of a wordline into a common charge dissipation region. Other symmetrical or asymmetrical alignments of common charge dissipation elements within an array are also contemplated and within the scope of the present invention.

DETAILED DESCRIPTION OF THE INVENTION

Figure 1:
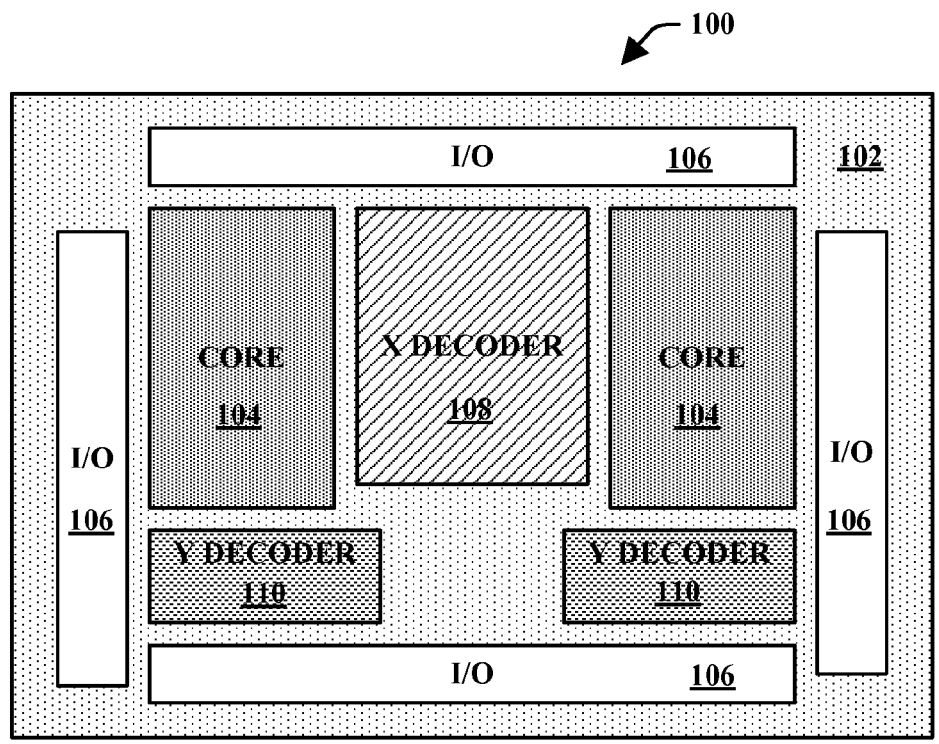
FIG. 1 is a top view of a dual bit flash stacked gate memory device according to one exemplary embodiment of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention facilitates memory devices and operation of dual bit and single bit memory devices by providing systems and methods that employ a salicide block to vary and equalize the resistance of a memory array during fabrication. The present invention includes utilizing a common charge dissipation region to mitigate charge-loss by providing protection against charging up of the various lines as a result of further plasma etching processes. The salicide block equalizes the charge dissipation in the memory array by providing each wordline path with a varied amount of resistance in addition to the total path resistance. Because the charge protection provided to each wordline otherwise varies depending on the resistance path to a common discharge element, a salicide block for resistance equalization provides greater reliability and predictability during processing. Other such shapes conducive for any desired resistance path fall within the scope of the invention.

Referring initially to the figures, FIG. 1 is a top view of an exemplary stacked gate dual bit flash memory device 100 that may be employed in accordance with an aspect of the present invention. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
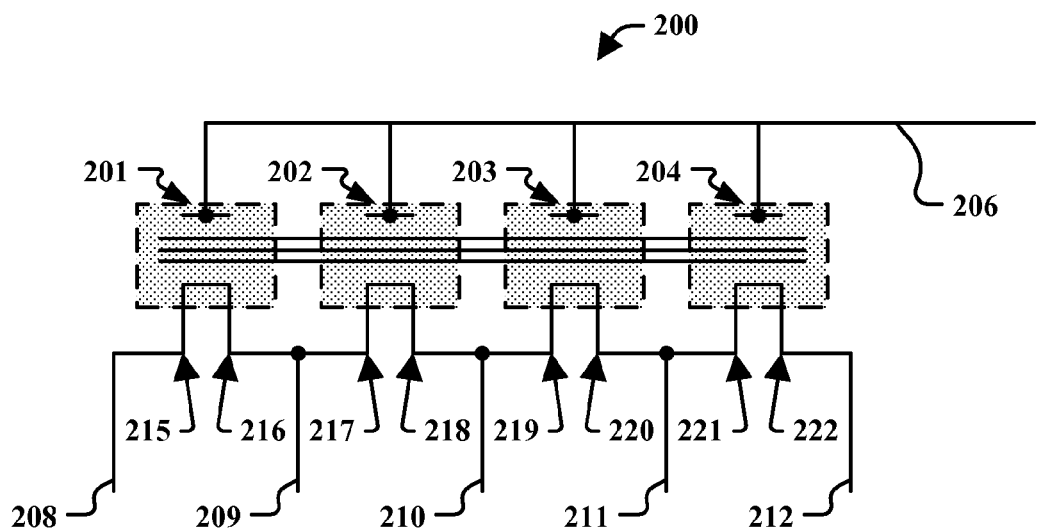
FIG. 2 is a schematic illustration of a portion of a memory array such as may include at least part of one of the memory devices depicted in FIG. 1 in a virtual ground type architecture according to another exemplary embodiment of the present invention.

Turning to FIG. 2, a schematic illustration is presented of a portion 200 of an exemplary memory core such as may include at least part of one of the M by N array cores 104 depicted in FIG. 1 in accordance with an aspect of the present invention. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
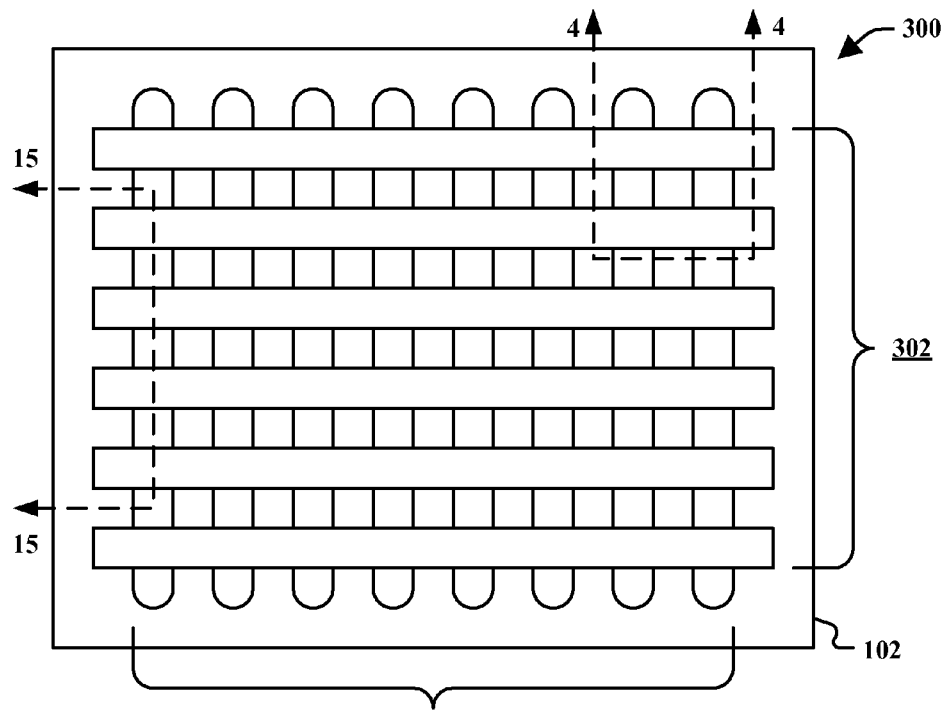
FIG. 3 is a top view of at least a portion of a memory core, such as may include at least part of one of the memory devices depicted in FIG. 1 according to an exemplary embodiment of the present invention.

Referring now to FIG. 3, a top view is presented of at least a portion 300 of a memory core, such as may include at least part of one of the M by N array cores 104 depicted in FIG. 1 in accordance with an aspect of the present invention. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
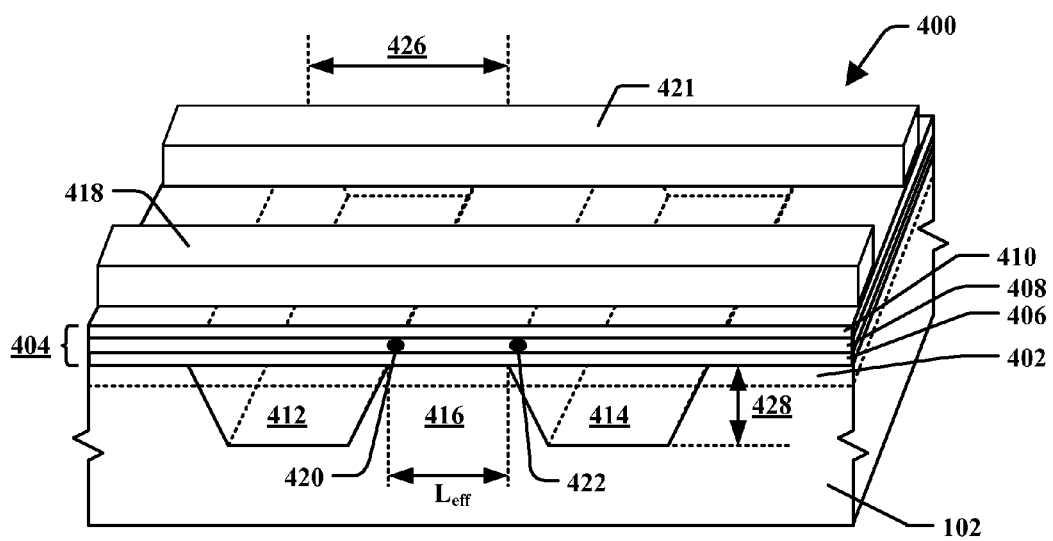
FIG. 4 is a cross-sectional isometric illustration of a portion of a dual bit flash stacked gate memory device, such as that taken along line 4-4 of FIG. 3 according to yet another exemplary embodiment of the present invention.

FIG. 4 is a cross-sectional isometric illustration of a portion 400 of a dual bit flash memory, such as that taken along line 4-4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping composite dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling).

Figure 5:
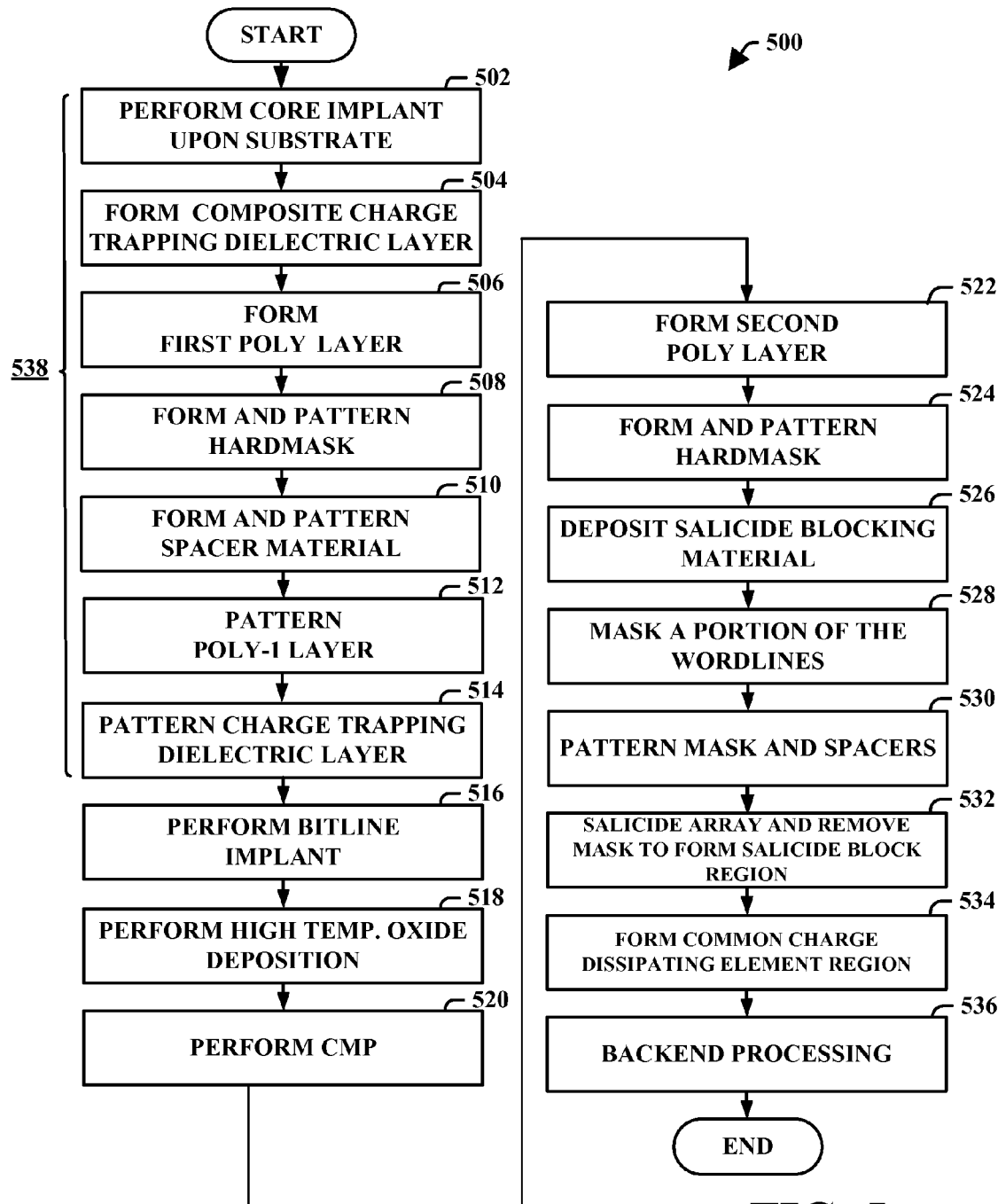
FIG. 5 is a flow diagram illustrating an example of a methodology for forming a dual bit type memory device in accordance with one or more aspects of the present invention, wherein salicide block regions are implemented to equilibrate the resistance path of a memory array according to an aspect of the present invention.

Turning to FIG. 5, a flow diagram illustrating a methodology 500 for forming a dual bit memory device according to one or more aspects of the present invention is presented. In particular, the memory device is formed so as to facilitate scaling via bitline width reduction which was heretofore not capable due to limitations associated with resists and/or other patterning materials, techniques or lithography tools. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated processes may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein.

The memory is formed upon a semiconductor substrate and a threshold adjustment implant $V_{tadjust}$ is performed to establish a region of the substrate at 502 that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory.

At 504 a charge trapping composite dielectric layer is formed over the semiconductor substrate. This portion of a charge trapping composite dielectric layer includes a first insulating layer, a charge trapping layer, and a second insulating layer. The charge trapping layer is formed in between the first and second insulating layers, also referred to as lower and upper insulating layers. The first and second insulating layers may be formed of an oxide dielectric such as silicon dioxide ($SiO_2$), for example, and the charge trapping layer may be formed of a nitride dielectric such as silicon nitride ($Si_xN_y$), for example. The first and second insulating layers can be formed to a thickness of about 70 Angstroms or less, for example, while the charge trapping layer can be formed to a thickness between about 60 to 80 Angstroms. It is appreciated that variations in the above thicknesses can be present in accordance with the present invention. Additionally, the upper insulating layer can be comprised of high-k dielectric material, and the like, for example.

Other multiple layer dielectric layers can be fabricated as the charge trapping dielectric layer including, but not limited to an ONO tri-layer dielectric (as described above), an oxide/nitride bi-layer dielectric, a nitride/oxide dielectric, an oxide/tantalum oxide dielectric ($SiO_2/Ta_2O_5$), an oxide/tantalum oxide/oxide dielectric ($SiO_2/Ta_2O_5/SiO_2$), an oxide/strontium titanate dielectric ($SiO_2/SrTiO_3$), an oxide/barium strontium titanate dielectric ($SiO_2/BaSrTiO_2$), an oxide/strontium titanate/oxide dielectric ($SiO_2/SrTiO_3/SiO_2$), an oxide/strontium titanate/barium strontium titanate dielectric ($SiO_2/SrTiO_3/BaSrTiO_2$), and the like.

A first layer of poly (polysilicon) based material(s) is then formed over the charge trapping dielectric layer at 506. This first poly layer can be formed to a thickness of between about 900 to 1100 Angstroms, for example. A layer of hardmask material is subsequently formed over the first poly layer at 508. An optional antireflective coating (ARC) layer (e.g., of an organic material, such as silicon nitride or silicon oxynitride) can also be formed over the hardmask, and a resist can be formed over the ARC layer to facilitate patterning the hardmask. The ARC layer in particular can assist with mitigating reflection during exposure and thereby improves the fidelity of pattern transfer. The hardmask can, for example, be formed from oxide based material(s) that are applied to a thickness of between about 300 to 700 Angstroms, for example.

The hardmask is then patterned at 508, as well, (e.g., after both the resist and optional ARC layers have been patterned, exposed, etched and/or selectively stripped to form a combined photomask for transferring the pattern onto the hardmask). The patterned features formed (e.g., etched) within the hardmask correspond, at least partially, to buried bitlines which will be formed within the substrate. More particularly, respective spacings between the features correspond somewhat to buried bitlines that will be implanted within the substrate. The spacings within the hardmask can be formed to have respective widths of between about 100 to 140 nanometers, for example.

At 510 a layer of spacer material (e.g., oxide based materials) is deposited over the patterned hardmask. The spacer material can be deposited to a thickness of between about 200 to 1000 Angstroms, for example, and is utilized to form spacers that assist with establishing narrower buried bitlines. This can be, for example, an isotropic deposition, wherein the layer grows on both the vertical and horizontal surfaces. As such, the spacer material is subsequently patterned or plasma etched (e.g., isotropically etched) at 510 to form sidewall spacers adjacent the patterned features of the hardmask, thereby reducing respective spacings between the hardmask features with precision. The spacers can be formed to have respective widths of between about 20 to 40 nanometers, for example. The distance between the spacers defines somewhat respective bitline openings having widths somewhere in the neighborhood of around 55 to 85 nanometers, for example. It will be appreciated that should an ARC (antireflective coating) layer be utilized in patterning the hardmask, the ARC layer would also be patterned and would add to the thickness of the oxide sidewall spacers and would contribute to narrowing the respective bitline openings. The etched spacer forms a mask for the first poly layer at 506 of method 500.

At 512 the first poly layer is then plasma etched and the sidewall spacers serve as guides and as such, spacings formed within the first poly layer have respective widths corresponding somewhat to that of the bitline openings. The plasma etch is an anisotropic process and in this case it etches in the vertical direction only. This degree of accuracy is not possible with photolithography wherein light diffraction limits the process. In addition a wet etch is an isotropic (equally in all directions) process and therefore not as accurate as the plasma etch employed herein. The charge trapping dielectric layer is similarly plasma etched at 514 to include spacings having respective widths corresponding to that of the bitline openings. The charge trapping composite dielectric layer (e.g., ONO) is etched away to expose the silicone for a high energy implant utilizing, for example, arsenic. Without etching the ONO layer the arsenic would have to be implanted at a high energy through the ONO layer, which can cause damage in the ONO layer. This could negatively impact the breakdown voltage and reduce it to a level that would necessitate repairing the ONO layer, for example.

It will be appreciated that the etchants utilized to remove the first and second dielectric layers of the ONO layer are also effective to remove the patterned hardmask features and the sidewall spacers since these features contain the same or a similar type of compound, namely an oxide. Should some traces of the hardmask features remain, these can be stripped or washed away at a later appropriate time. It is also to be appreciated that 502 through 514 can be carried out in a variety of ways and can be referred to jointly as front end processing 538.

A bitline implant can then, for example, be performed at 516 to establish the buried bitlines within the exposed semiconductor substrate. The bitline implant can include an n-type dopant, such as Arsenic, for example. In one example, the bitlines are formed to a width of about 70 nanometers. A high temperature oxide deposition can then be performed at 518 to fill in the respective spacings formed within the charge trapping dielectric layer. The high temperature oxide deposition can be performed at temperatures between around 700 to 1200 degrees Celsius, for example. The high temperature oxide deposition can cause oxide growth over the respective bitlines while also depositing oxide over the buried bitlines.

In one example, about 100 Angstroms of an oxide is grown, while an additional, approximately 100 Angstroms, of an oxide is deposited over the bitlines. The entire wafer can then be subjected to chemical mechanical polishing (CMP) at 520 to remove any excess oxide and planarize the surface of the structures thereon.

The bitline implant can include one or more n-type dopants (e.g., arsenic, phosphorous and/or antimony) and can be performed at a concentration of between about 0.5E15 and 2E15 atoms/cm$^3$ at an energy level of between about 10 to 70 KeV, for example. It will be appreciated, however, that other suitable implant compositions and concentrations are contemplated as falling within the scope of the present invention. The buried bitlines act as acting sources and acting drains for corresponding memory cells, and respective channels are defined between corresponding pairs of buried bitlines.

A repair operation can optionally be performed in order to correct or mitigate damage that may have occurred to the charge trapping dielectric layer during the bitline implant operation. In alternate aspects of the method, the second insulation layer of the charge trapping dielectric layer is formed after performing the bitline implant, instead of before.

At 522 a second layer of poly based material(s) can, for example, then be formed over the poly-1. As with the poly-1, this second poly layer (poly-2) can be formed (not shown) to a thickness of between about 900 to 1100 Angstroms, for example. The second poly layer (poly-2) can serve as a wordline material and as such can be patterned into wordlines. Accordingly, the second poly layer can be formed and patterned with hardmask at 524 to establish wordlines over the buried bitlines (e.g., at a substantially 90 degree orientation).

At 526 a layer of salicide blocking material (e.g., silicon rich nitride materials) is deposited over the plurality of wordlines. This process may be, for example, an isotropic deposition, wherein the layer grows on both the vertical and horizontal surfaces. The salicide blocking material may be deposited to a thickness of between about 200 to 1000 Angstroms, for example about 400 Angstroms. It is appreciated that variations in the above thicknesses can be present in accordance with the present invention. At 528 a portion of the wordlines are masked and the mask is patterned and etched to form spacers at 530. In accordance with one or more embodiments of the present invention the mask is deposited anisotropically over a portion a plurality of wordlines to block subsequent patterning (e.g., etching) of spacers at 530 in the respective region. Additionally, the spacers may be utilized, for example to assist with establishing narrower buried bitlines. In particular, this salicide blocking material may block interaction between salicided regions above the wordlines and beside bitlines.

As such, the mask is first patterned or plasma etched at 530 (e.g., anisotropically etched) to selectively vary the degree and measured angle of salicide blocking material overlying a wordline. Varying the degree and angle of the salicide blocking material overlying each wordline allows for equalizing the total resistance of each respective wordline path to a common discharge region. Subsequently, the salicide blocking material is patterned or plasma etched (e.g., isotropically etched) to form sidewall spacers adjacent the patterned features of a hardmask (e.g., photoresist) and next to the mask formed over at least a portion of the plurality of wordlines.

Further, in accordance with one or more embodiments of the present invention the salicide blocking material is utilized to prevent or block saliciding along a portion of wordlines coupled to a common charge dissipation region or a common discharge element as formed at 534. By blocking salicide formation as done at 532 on a portion of the wordlines the resistance is increased along the blocked area relative to the salicided portions of the respective wordlines coupled to a common discharge region.

In accordance with one or more embodiments of the present invention the masked portion of the plurality of wordlines coupled to a common discharge region prevents any spacers from being formed in that area and therefore increases the resistance there between wordlines enough to prevent shorting of the wordlines. Further, the resistance of the masked portion of wordlines is not too high such that any line charge during subsequent processing may not be drained off. In one example of the present invention, a triangular shaped salicide block is formed in order to vary the amount of salicide blocking material overlying each wordline and equalizes the total resistance relative to each wordline path from a wordline node to a common discharge region. A variety of shapes and/or wedges may be utilized in accordance with the scope of the present invention to equalize the resistance in an array. Further, the scope of the present invention is not limited to any particular shape of the salicided block region.

Still at 536 a common discharge element is formed as one example of the present invention. The common discharge element is a capacitor as one example and may be formed by implanting a gate oxide material into a semiconductor substrate through various processes for forming wells or implantation regions. Above the gate oxide layer formed in a common discharge element region is a polysilicon layer as one aspect of the present invention patterned with a common shorting element connecting a portion of a plurality of wordlines overlying buried bitlines.

The methodology may then continue on for further processing at 536. The processes and acts at and beyond 536 can be referred to as back end processing and can be carried out in numerous ways.

FIGS. 6-13, described below, serve to illustrate an exemplary stacked gate dual bit type device formed in accordance with the present invention according to the method 500 illustrated in FIG. 5. The FIGS. 6-13 illustrate exemplary structures and dimensions to further illustrate the present invention and the method 500 of FIG. 5. However, it is appreciated that variations in the illustrated structures and dimensions can be present and still would be in accordance with the present invention. In addition the present invention relates to single bit memory devices as well.

Figure 6:
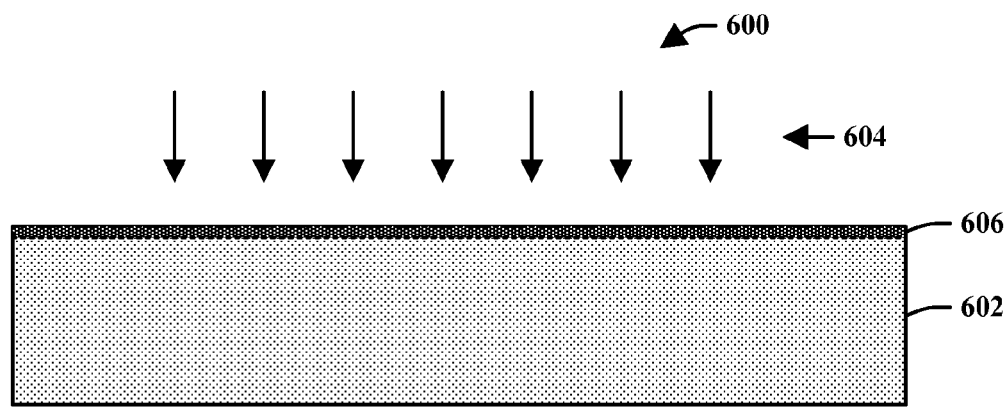
FIGS. 6-21 are cross-sectional illustrations of dual bit type memory formed according to one or more aspects of the present invention.

FIG. 6 is a cross sectional side view of a dual bit memory device 600 in accordance with an aspect of the present invention. An optional threshold adjustment or core implant 604 is performed to establish a region 606 of a substrate 602 that is more heavily doped than a remainder of the substrate 602. The threshold adjustment implant 604, performed at 502 of FIG. 5, includes implanting a suitable dopant (e.g., boron) such that the more heavily doped region 606 has a greater dopant concentration than remaining regions of the substrate 602.

Figure 7:
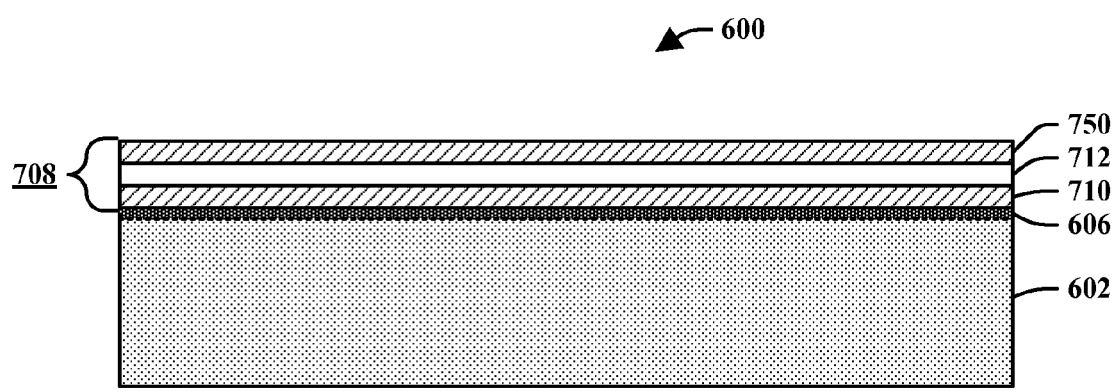

FIG. 7 is a cross sectional side view of the dual bit memory device 600 after formation of an exemplary composite charge trapping dielectric layer 708 in accordance with an aspect of the present invention. The composite charge trapping dielectric layer 708 is shown formed on the more heavily doped region 606 of the substrate 602. The composite charge trapping dielectric layer 708 includes a first or lower insulating/dielectric layer 710, a charge-trapping layer 712, and a second or upper insulating/dielectric layer 750.

The first and second insulating layers, 710 and 750 respectively, may be formed of an oxide dielectric such as silicon dioxide ($SiO_2$). The charge trapping layer 712 is comprised of a suitable material such as silicon nitride. The composite charge trapping dielectric layer 708 can be comprised of other materials and layers including, but not limited to an oxide-nitride-oxide (commonly referred to as ONO) layer an oxide/nitride bilayer dielectric, a nitride/oxide layer dielectric, an oxide/tantalum oxide layer ($SiO_2/Ta_2O_5$), an oxide/tantalum oxide/oxide layer ($SiO_2/Ta_2O_5/SiO_2$), an oxide/strontium titanate layer ($SiO_2/SrTiO_3$), an oxide/barium strontium titanate layer ($SiO_2/BaSrTiO_2$), an oxide/strontium titanate/oxide layer ($SiO_2/SrTiO_3/SiO_2$), an oxide/strontium titanate/barium strontium titanate trilayer dielectric ($SiO_2/SrTiO_3/BaSrTiO_2$), and the like. It is also contemplated that the second insulating layer 750 can be comprised of a high-k dielectric material.

Figure 8:
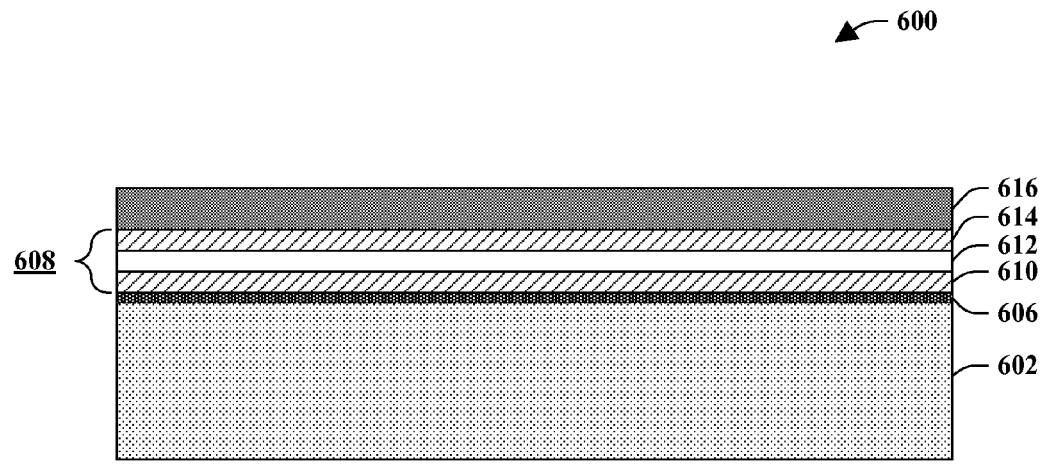
Figure 9:
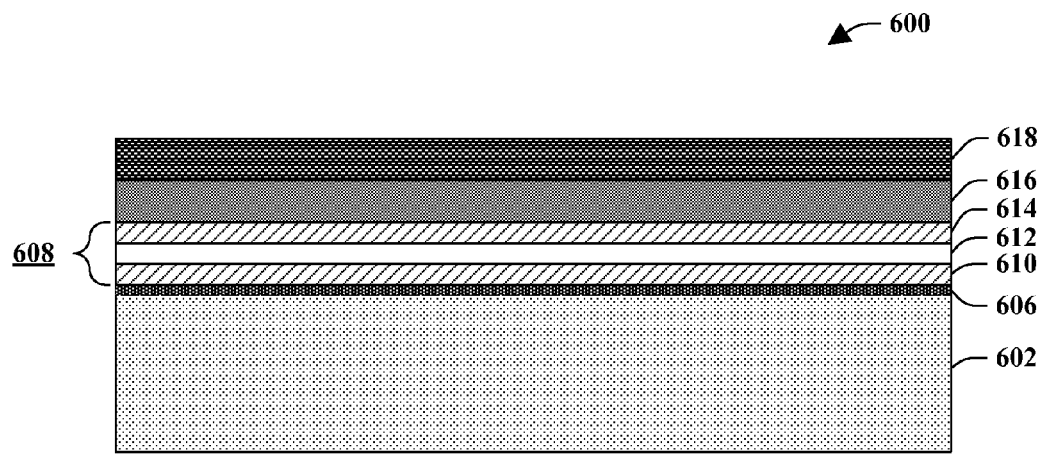

A first layer of poly based material(s) (poly-1) 616 can then be formed over the charge trapping dielectric layer 608 (FIG. 8). This first poly layer 616 can be formed to a thickness of between about 900 to 1100 Angstroms, for example. A layer of hardmask material 618 can be subsequently formed over the first poly layer 616 as illustrated in FIG. 9. An optional antireflective coating (ARC) layer (not shown) that may include an organic material, such as silicon nitride or silicon oxynitride, for example, can be formed over the hardmask 618, and a resist (also not shown) can be formed over the ARC layer to facilitate patterning the hardmask 618. The ARC layer in particular assists with mitigating reflection during exposure and thereby improves the fidelity of pattern transfer. The hardmask 618 can, for example, be formed from oxide based material(s) that are applied to a thickness of between about 300 to 700 Angstroms, for example.

Figure 10:
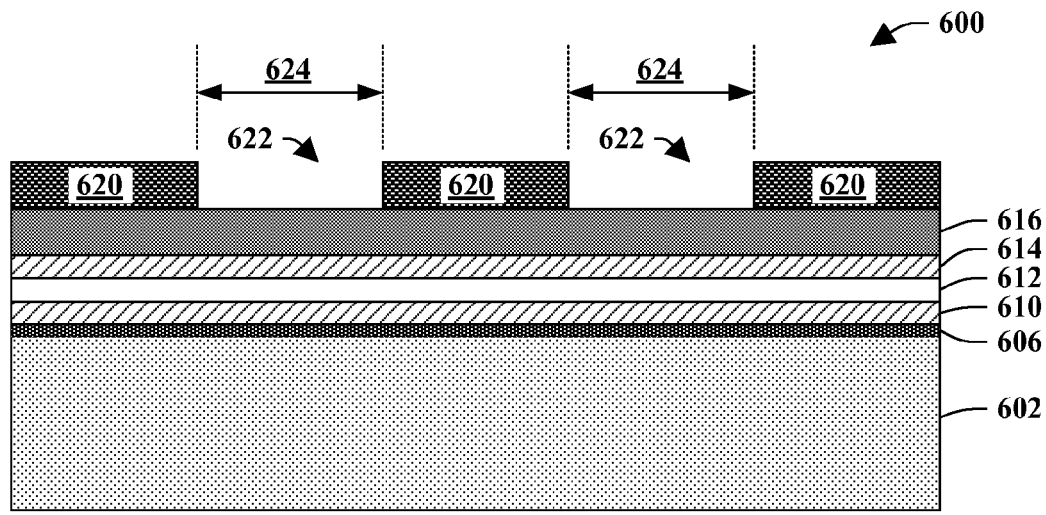

The hardmask 618 can then be patterned (e.g., after both the resist and optional ARC layers have been patterned, exposed, etched and/or selectively stripped to form a combined photomask for transferring the pattern onto the hardmask) as shown in FIG. 10. The resulting hardmask features 620 formed (e.g., etched) from the hardmask 618 (FIG. 9) correspond, at least partially, to buried bitlines which will be formed within the substrate 602. More particularly, respective spacings 622 between the features 620 correspond somewhat to buried bitlines that will be implanted within the substrate 602. The spacings 622 within the hardmask 618 can be formed to have respective widths 624 of between about 100 to 140 nanometers, for example.

Figure 11:
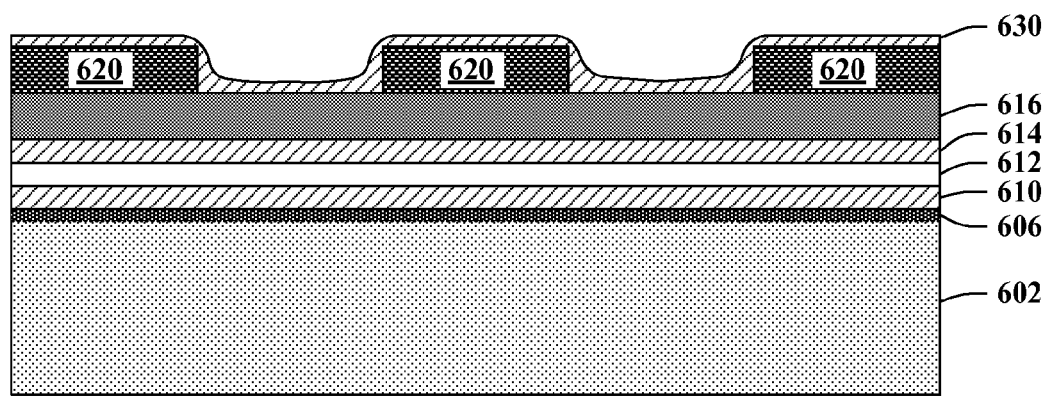
Figure 12:
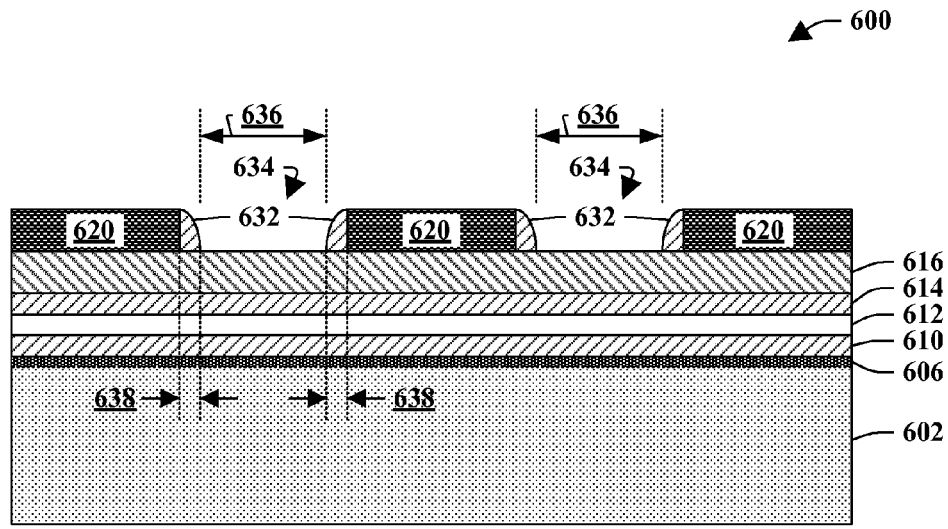

In FIG. 11, an optional layer of spacer material 630 (e.g., of oxide based material(s)) can then be formed over the patterned hardmask features 620 and exposed portions of the poly-1 layer 616. The spacer material 630 can be formed to a thickness of between about 200 to 500 Angstroms, for example, and is utilized to form spacers that assist with establishing narrower buried bitlines. As such, the spacer material 630 is then patterned (e.g., isotropically etched) to form sidewall spacers 632 adjacent to the patterned features 620 of the hardmask (FIG. 12). The distance between the spacers 632 defines respective bitline openings 634 having widths 636 somewhere in the neighborhood of around 55 to 85 nanometers, for example. The sidewall spacers can have respective widths 638 of between about 20 to 40 nanometers, for example. It will be appreciated that should an ARC layer be utilized in patterning the hardmask 618 (FIG. 9), the ARC layer would also be patterned and would add to the thickness of the sidewall spacers 632 and thus would contribute to narrowing the respective bitline openings 634.

Figure 13:
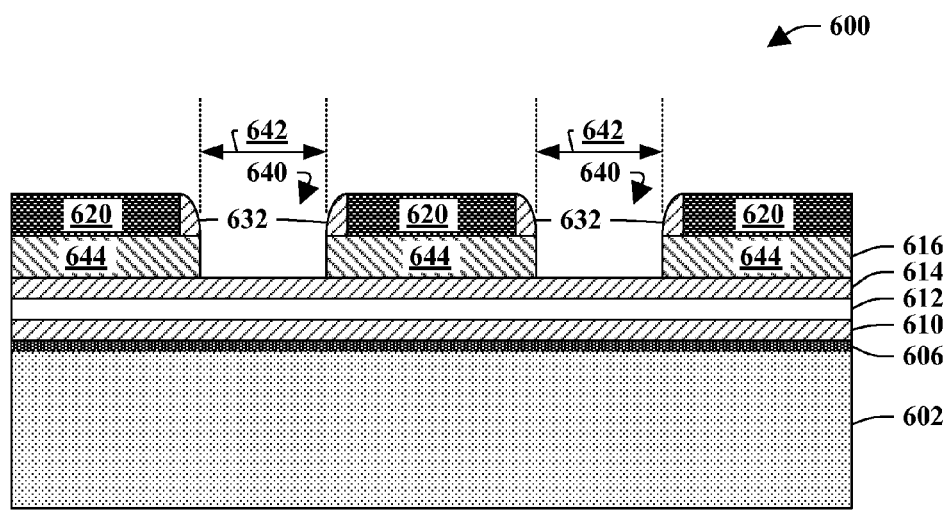
Figure 14:
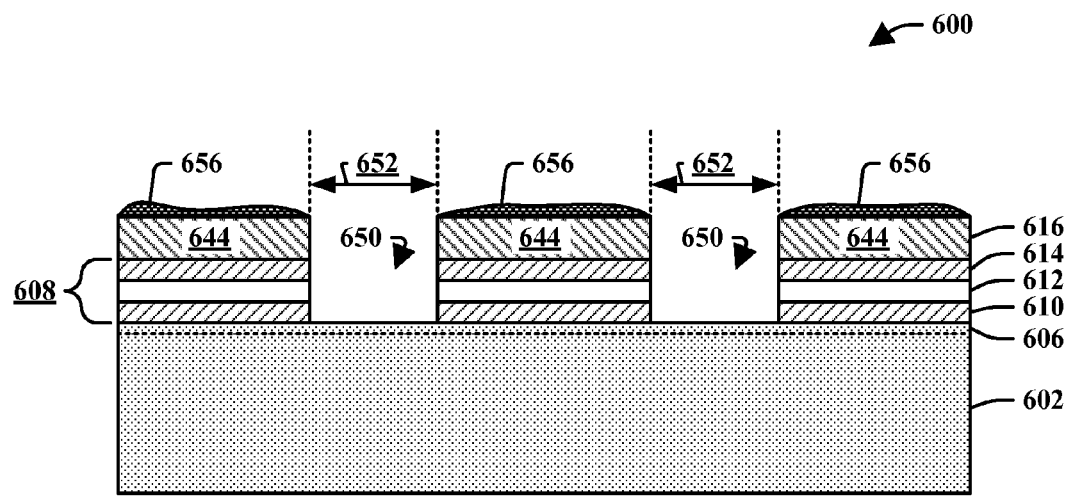
Figure 15:
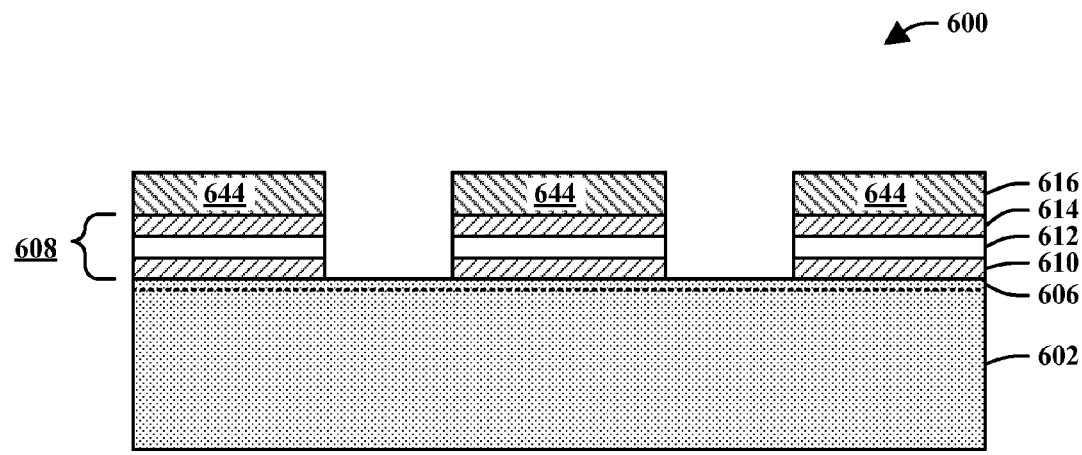

In FIG. 13, the poly-1 layer 616 is then patterned with the sidewall spacers 632 serving as guides. As such, spacings 640 formed within the first poly layer 616 can have respective widths 642 corresponding to the widths 636 of the bitline openings 634 (FIG. 12). It will be appreciated that in a three dimensional perspective the first poly layer 616 is patterned into parallel "strips" 644 of first poly material 616. The charge trapping dielectric layer 608 is similarly patterned in FIG. 14 to include spacings 650 having respective widths 652 also corresponding to that 636 of the bitline openings 634 (FIG. 12). It will be appreciated that the etchants utilized to remove the first 610 and second 614 dielectric layers can also be effective to remove the patterned hardmask features 620 and the sidewall spacers 632 (FIG. 13) since these features contain the same or a similar type of compound, namely oxide based materials. Should some traces 656 of the hardmask features remain (FIG. 14), these can be stripped or washed away at a later time to reveal a clean patterned poly-1 layer 644 (FIG. 15).

Figure 16:
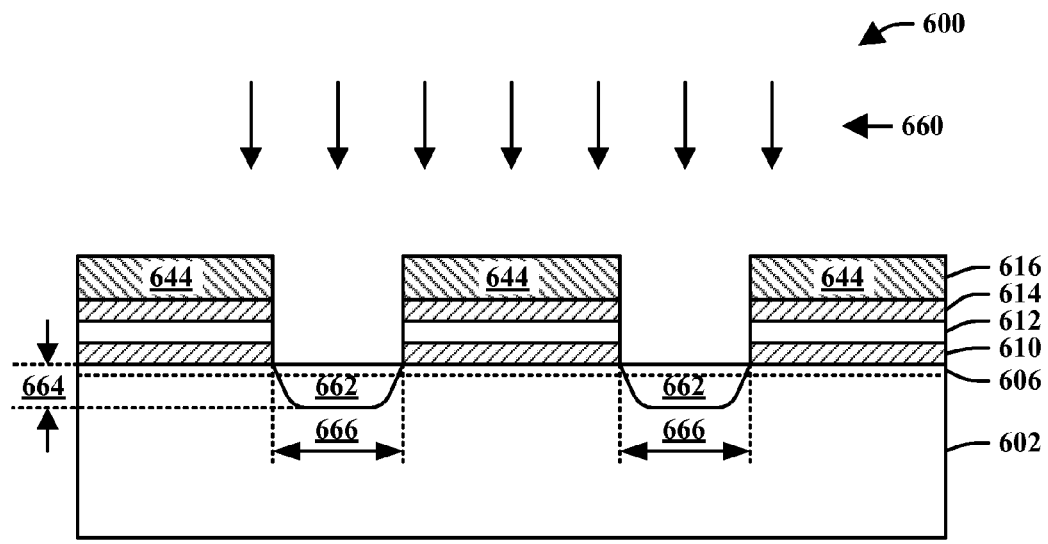

A bitline implant 660 can be performed to establish the buried bitlines 662 within the semiconductor substrate 602 (FIG. 16). The bitline implant 660 can include an n-type dopant, such as Arsenic, for example. Similarly, the bitlines 662 can be formed to relatively shallow depths 664 of between about 300 to 500 Angstroms. Additionally, the bitline implant may be performed at a dosage of about 1E15/cm2 for a resulting concentration of about 2E20/cm3, for example. The first poly 616 and ONO 608 layers block the implant 660, and the bitlines 662 are accordingly formed to a width 666 that corresponds substantially to that spacing 636 of the bitline openings 634. This width 666 can be about 70 nanometers, for example (FIG. 14) due, at least in part, to the use of the sidewall spacers 632 (FIG. 12).

A high temperature oxide deposition 668 can then be performed to fill the respective spacings 650 formed within the charge trapping dielectric layer 608 with an oxide based material 670 (FIG. 16). The high temperature oxide deposition can be performed at temperatures between around 700 to 1200 degrees Celsius, for example. The high temperature oxide deposition causes oxide growth over the respective bitlines 662 while also depositing oxide over the buried bitlines. In one example, about 100 Angstroms of an oxide is grown, while an additional approximately 100 Angstroms of an oxide is deposited over the bitlines 662.

Figure 18:
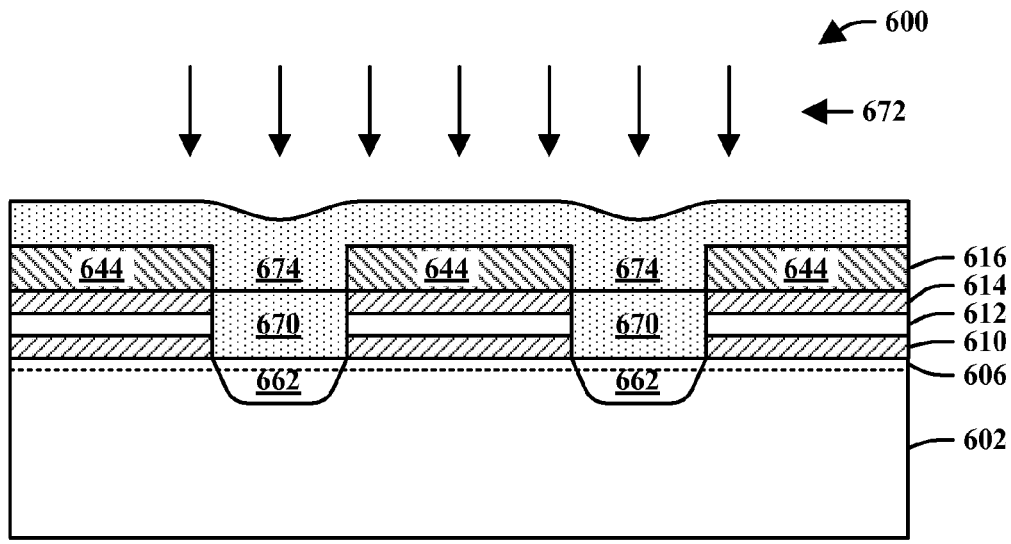
Figure 19:
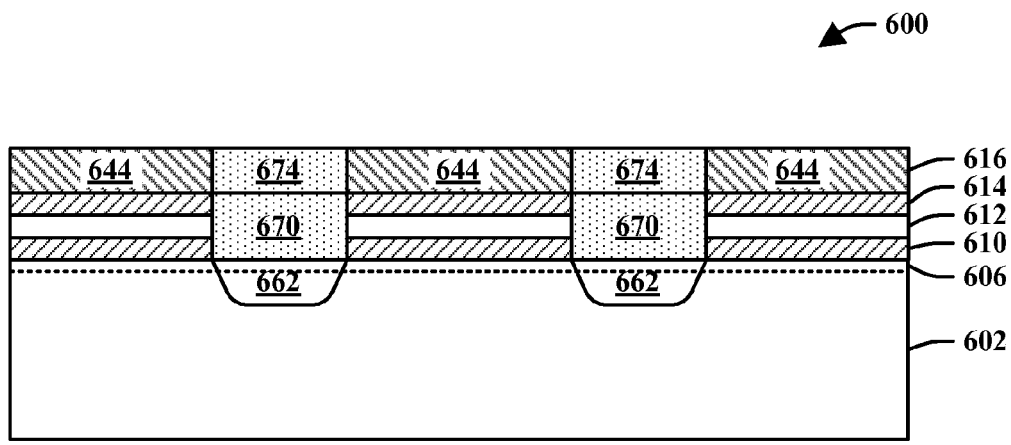

A high density plasma (HDP) deposition 672 is then performed to fill the respective spacings 640 formed within the first poly layer 616 with an oxide material 674 (FIG. 18). The HDP deposition 672 can, for example, be performed at a temperature of about 300° C. to about 700° C. and under a pressure of about 1-10 mTorr to fill in the first poly spacings 640. The entire wafer can then be subjected to chemical mechanical polishing (CMP) to remove any excess oxide material 674 and planarize the surface of the structures thereon (FIG. 19). It will be appreciated that in a three dimensional perspective this results in "strips" of oxide material 674 in parallel with the patterned strips 644 of the first poly material 616.

Figure 17:
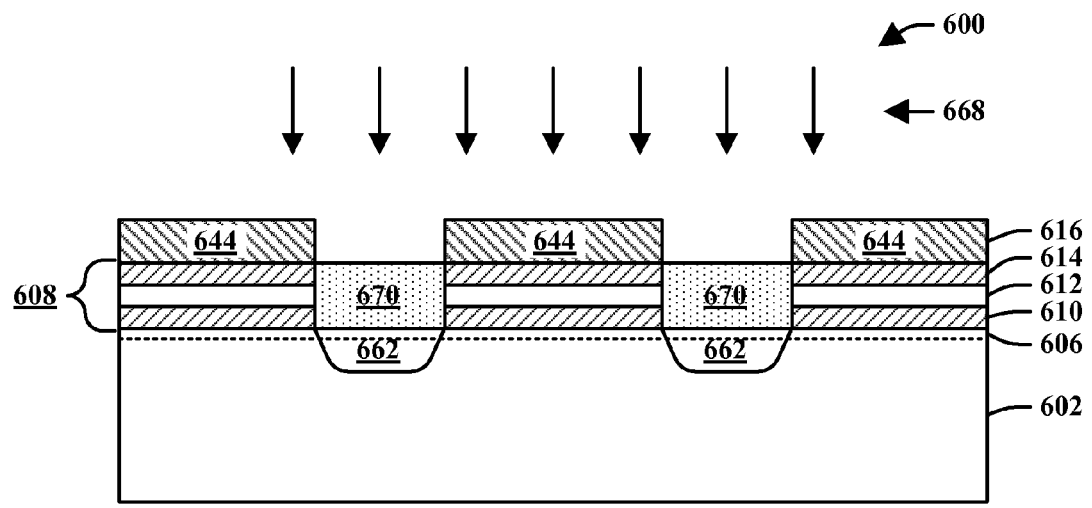
Figure 20:
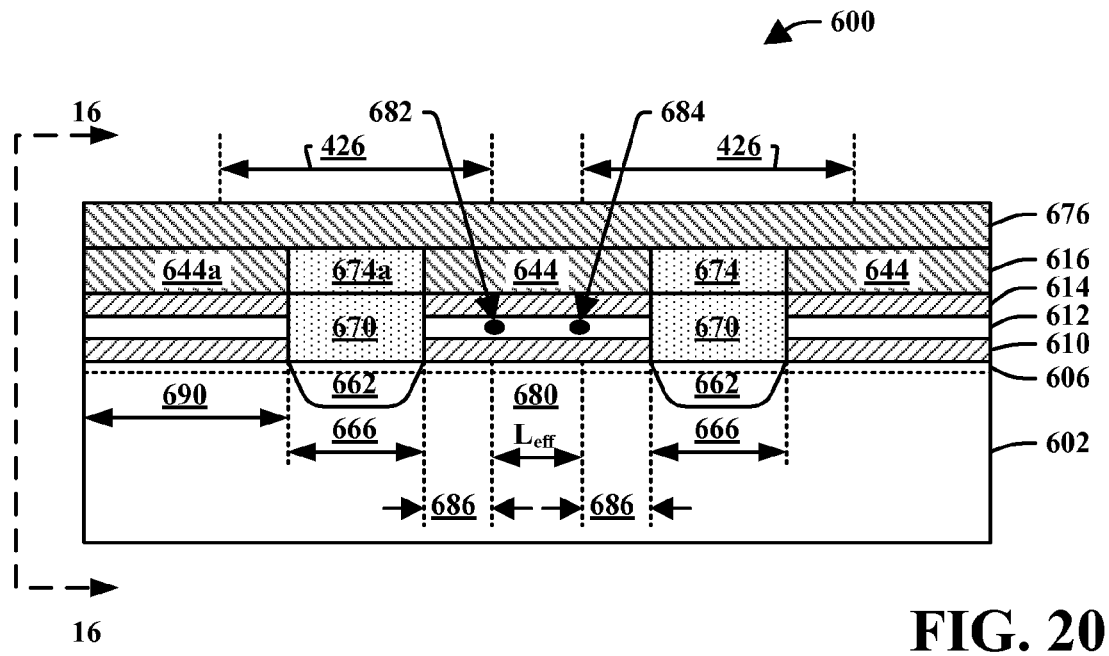
Figure 21:
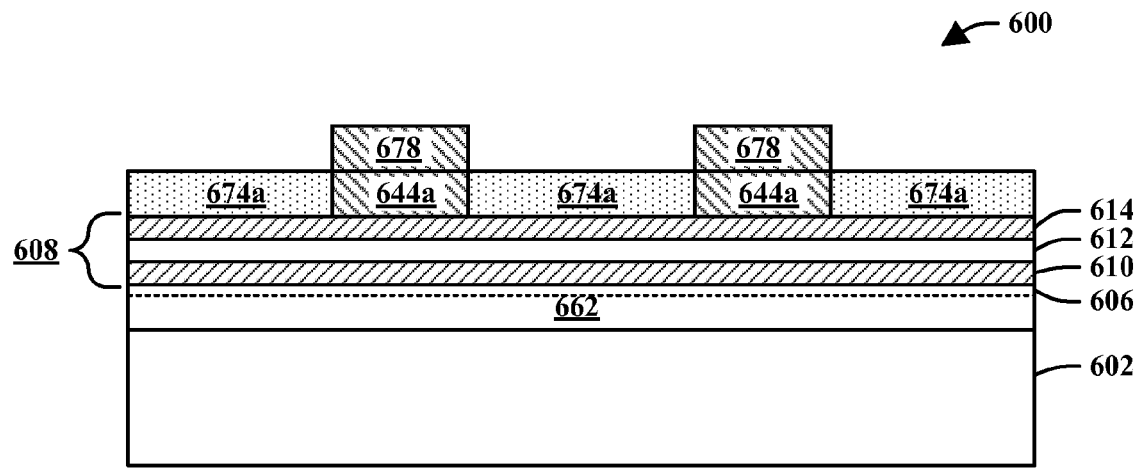

A second layer of poly-2 based material(s) 676 can then be formed over the first ploy-1 layer 616 (FIG. 20). As with the ploy-1 layer 616, this poly-2 layer 676 can be formed to thickness of between about 900 to 1100 Angstroms, for example. The poly-2 layer 676 can serve as a wordline material and as such can be patterned into wordlines. Accordingly, the poly-2 layer 676 can then be patterned to establish wordlines 678 over the buried bitlines 662 (FIG. 17). It will be appreciated that the wordlines 678 are formed so as to be oriented at approximately 90 degrees relative to the bitlines 662. This "crossed" orientation allows individual memory cells to be addressed. The illustration depicted in FIG. 21 is accordingly rotated approximately 90 degrees relative to the images illustrated in FIGS. 6-20. As such, a side view or view along the length of a buried bitline 662 is illustrated in FIG.

21. FIG. 21 can also be thought of as a view into FIG. 20 along lines 16-16 with the poly-2 layer 676 patterned into the wordlines 678.

Figure 22:
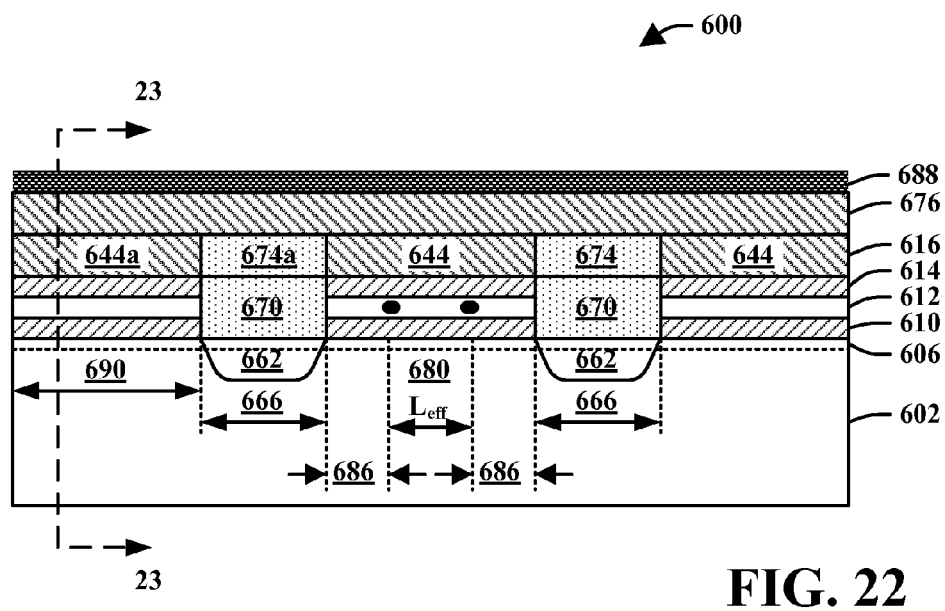
FIG. 22-28 are isometric views of at least a portion of a memory array, similar to that depicted in FIG. 3, but representative instead to dual bit memory devices formed in accordance with one or more aspects of the present invention.
Figure 23:
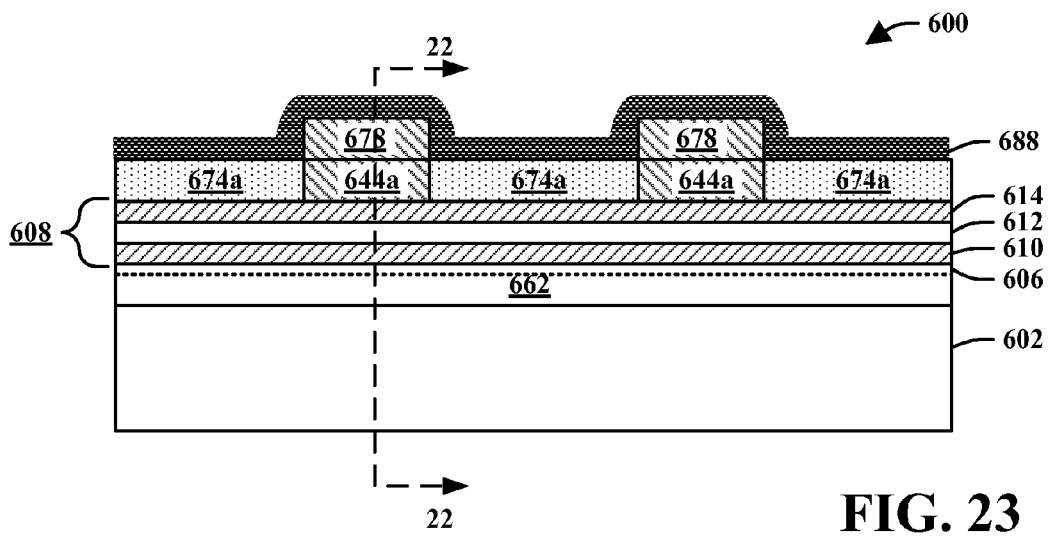

FIG. 22 is an orthogonal cross sectional view of a section of the dual bit memory device 600, as shown in FIG. 23, looking along section view 22-22. As shown in FIG. 22, a salicide blocking material 688 is deposited over the tops and sides of the wordlines 678 in accordance with one or more aspects of the present invention, for example. As mentioned supra, FIG. 23 is rotated 90° relative to FIG. 22 and depicts wordlines 678 and a single bitline 662.

Figure 24:
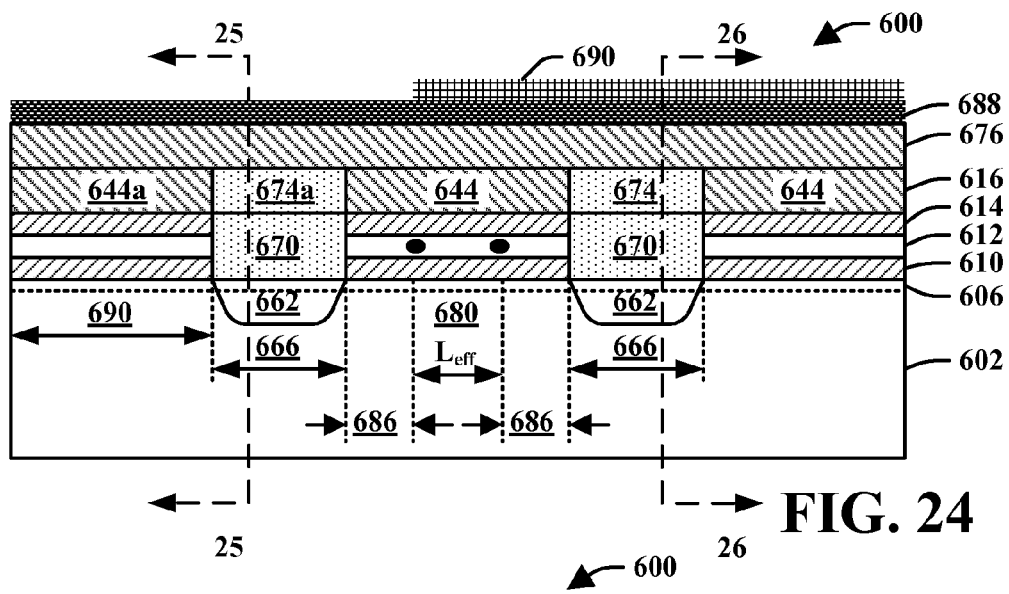
Figure 25:
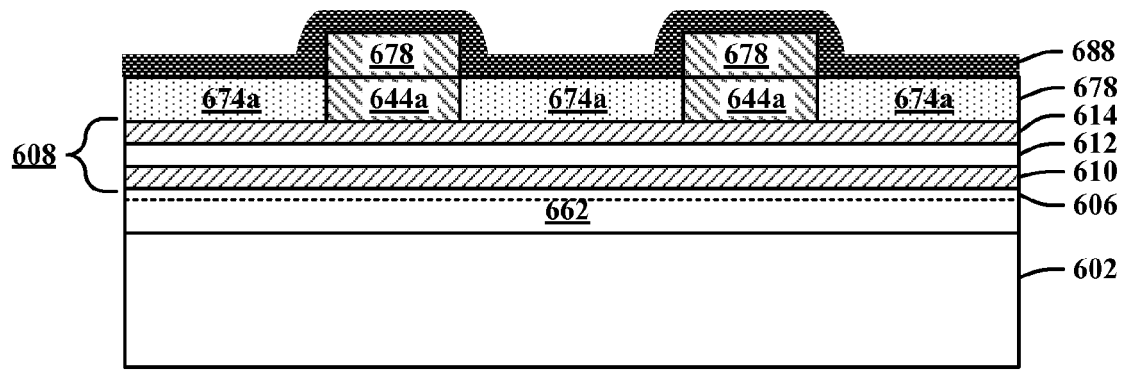
Figure 26:
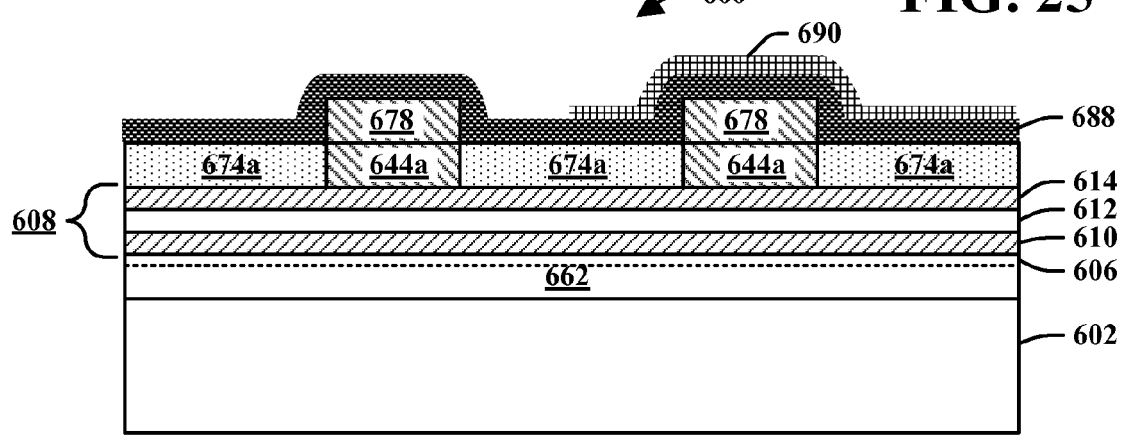

FIG. 24 illustrates the salicide blocking material 688, for example, a silicon rich nitride material deposited along various portions of the wordlines 678. The blocking material 688 deposited on various wordlines 678 will be described in detail infra. FIG. 25 is an orthogonal cross sectional view of a section of the dual bit memory device 600, as shown in FIG. 24, looking along section view 25-25. FIG. 26 is an orthogonal cross sectional view of a section of the dual bit memory device 600, as shown in FIG. 24, looking along section view 26-26. As shown in FIG. 26, a salicide mask 690 is deposited over a portion of the tops and sides of the salicide 688 deposited on the wordlines 678 in accordance with one or more aspects of the present invention, for example. As mentioned supra, FIG. 25 and 26 are rotated 90° relative to FIG. 24 and depict salicide covered wordlines 678 and a single bitline 662. FIG. 25 is identical to FIG. 26, except for the addition of the mask 690 in FIG. 26.

Figure 27:
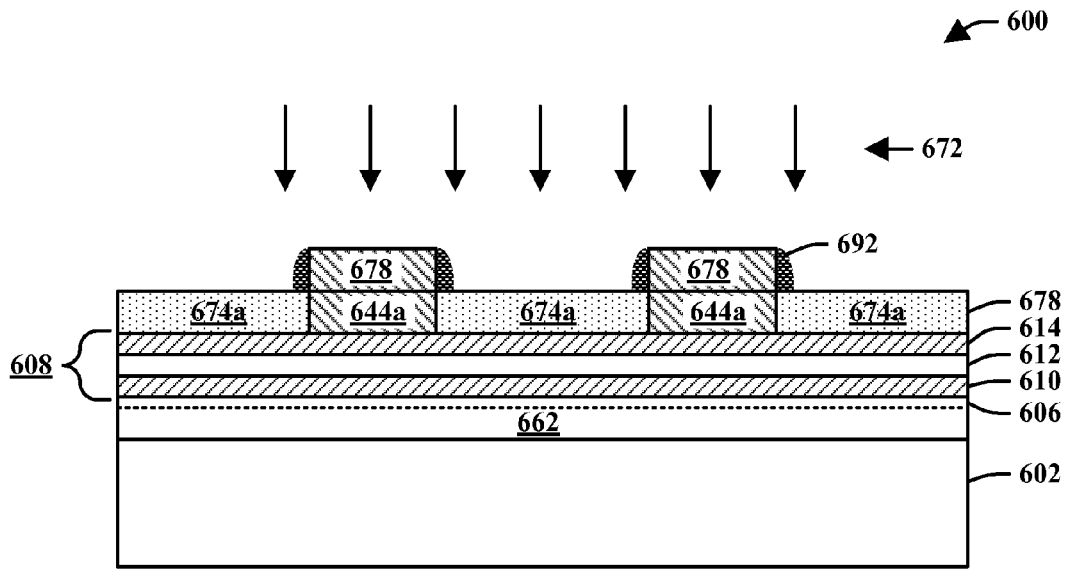

The formation of sidewall spacers 692 is illustrated in FIG. 27. Initially, for example, salicide blocking material can be formed on the sidewalls of the wordlines 678. The salicide blocking material 688 may have a thickness of between about 200 to 1000 Angstroms, for example, about 400 Angstroms. It is appreciated that variations in the above thicknesses can occur in accordance with the present invention. The formation of sidewall spacers is well known by those of ordinary skill in the art.

According to one aspect of the present invention by varying the amount and angle of the salicide blocking material 688 overlying a plurality of wordlines 678 the resistance of each wordline 678 to a common discharge region/device can be equalized. This will be described in further detail infra. Subsequently, the salicide blocking material 688 can be patterned or plasma etched 694 (e.g., isotropically etched) to form sidewall spacers 678 adjacent the patterned features of a hardmask (e.g., photoresist) and next to the mask 690 formed over at least a portion of the plurality of wordlines 678.

Figure 28:
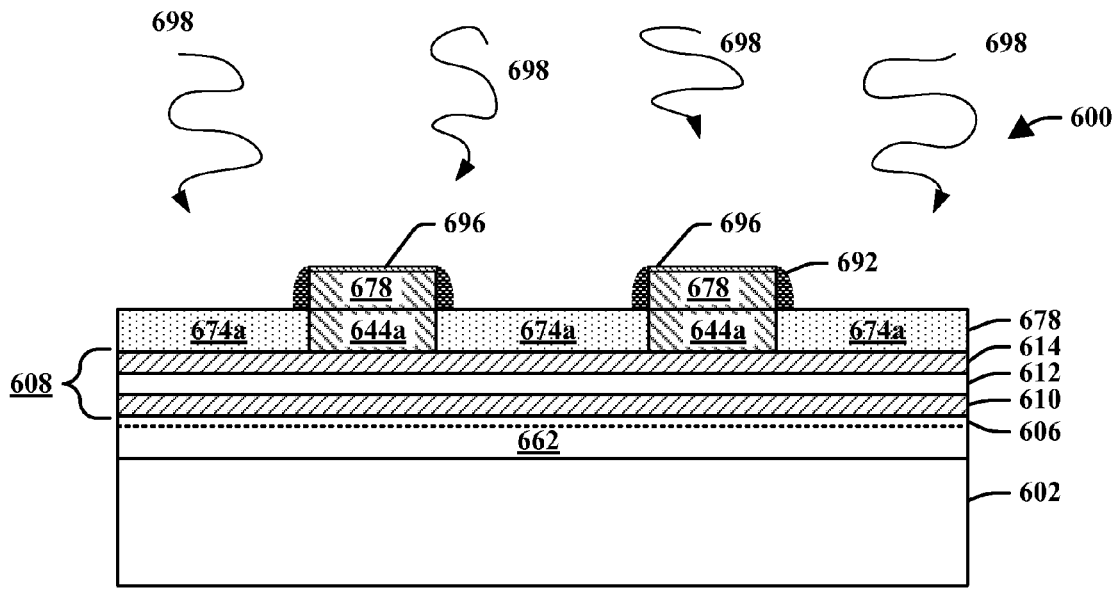

As one example, an implant metal oxide layer 696 of FIG. 28 may be grown on the wordlines 678 to react with the silicide. After thermal processing 698 as illustrated in FIG. 28, a wordline salicide region 696 is formed on an upper surface of the wordlines 678. The implant oxide layer can mitigate dopant diffusion. Further, the presence of wordline salicide region(s) 696 can reduce contact resistance. In accordance with one or more embodiments of the present invention, after the mask 690 is removed a region of high resistance between wordlines 678 coupled to a common charge dissipating region forms relative to the upper surface of a portion of the wordlines 962 with a salicided region 696. Alternatively, the salicide block 688 prevents saliciding of the region that has the mask 690.

At FIG. 28, the inventors of the present invention appreciate that the salicide blocking material 688 may be utilized to block saliciding as depicted in FIG. 28 at 696 along a portion of wordlines 678. By blocking salicide formation 696 as depicted on the wordlines 678, the present inventors appreciate that the resistance may be increased along the blocked area relative to the salicided portions 696 of the respective wordlines 678. In one embodiment of the present invention the portion of wordlines 678 are blocked to prevent saliciding 696 are blocked in a degree and measure so as to vary the resistance of each wordline path in a manner that equalizes the total path resistance of each wordline 678 to a common discharge region.

Figure 29:
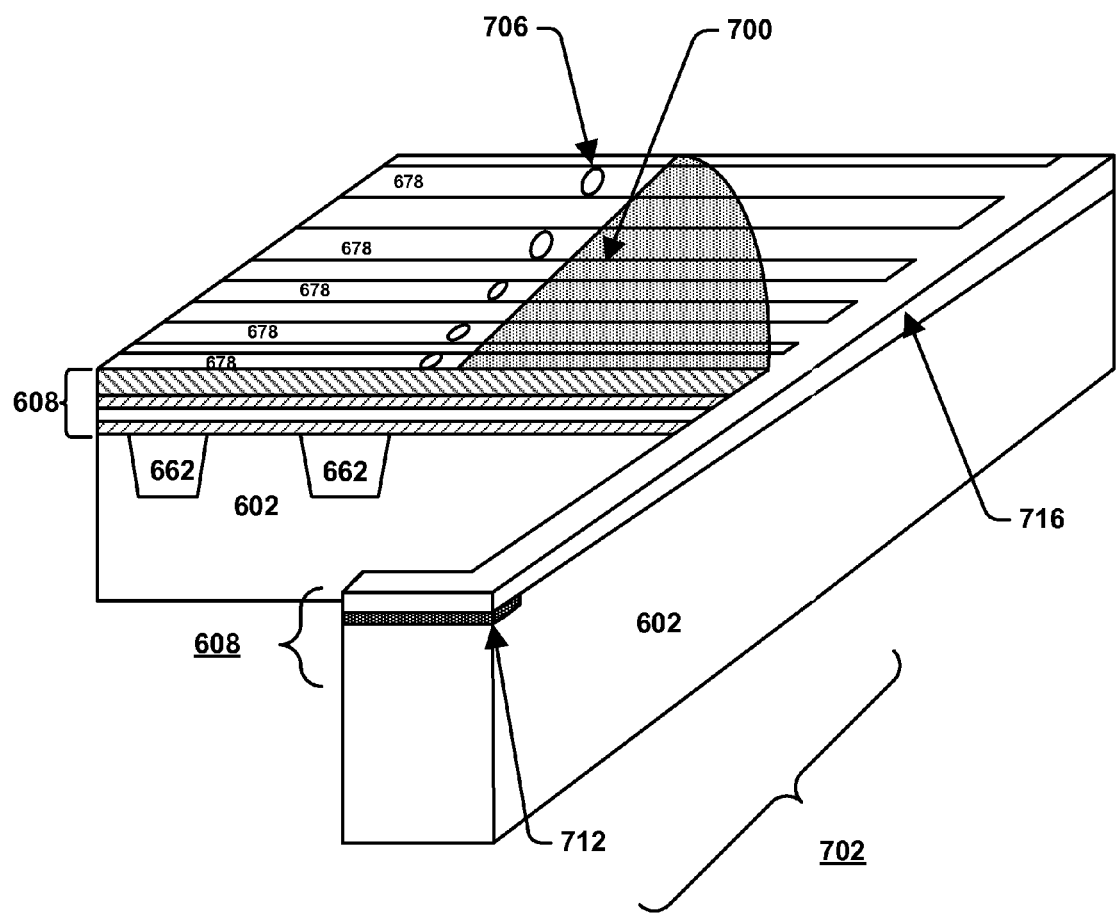
FIG. 29-31 are top views of at least a portion of a dual bit type memory array, with various shaped salicide block region(s) in accordance with one or more aspects of the present invention.

At FIG. 29, in accordance with one or more embodiments of the present invention the salicide blocked portion 700 of the plurality of wordlines 678 coupled to a common discharge region 702 prevents spacers 692 (FIG. 18) from being formed in the area 700 and therefore increases the resistance between wordlines 678 enough to prevent shorting of the wordlines 678 from within the blocked area but not enough to prevent any line charge during subsequent processing from being drained off for each wordline 678 into a common discharge region 702.

In one embodiment of the present invention the blocked area 700 is shaped in the form of a wedge. Many other shapes may be desirable and are within the scope of the present invention. Other shapes conducive for any desired resistance path fall within the scope of the invention. Any shape of the salicide block 700 may be utilized by varying the measured angle and degree of salicide block 700 on each wordline 678 or calculated so that the total wordline path resistance of each wordline 678 is equal from a wordline node 706 to a common discharge region 702. The resistance is made higher in the region 700 where saliciding is blocked and varied for each wordline 678 relative to the distance from each wordline node 706 to the common discharge region 608 so as to equalize the resistance for each path.

One example of a common discharge element in accordance with the present invention utilized is a capacitor 712. The common discharge element is in one example a capacitor and may be formed by implanting a gate oxide material 710 into a semiconductor substrate 602 through various processes for forming wells or implantation regions. In accordance with one embodiment of the present invention, above the gate oxide layer 1150 formed in a common discharge element region 712 is a polysilicon layer patterned accordingly with a common shorting element 716 connecting a portion of a plurality of wordlines.

One embodiment of the common discharge element 712 resides above a semiconductor substrate with the gate oxide layer above the semiconductor substrate with a thickness of about 30° Angstroms. Any other method known by one of ordinary skill in the art may be utilized for formation of a common element including but not limited to forming wells and other implants performed for the purposes of a common element.

Figure 30:
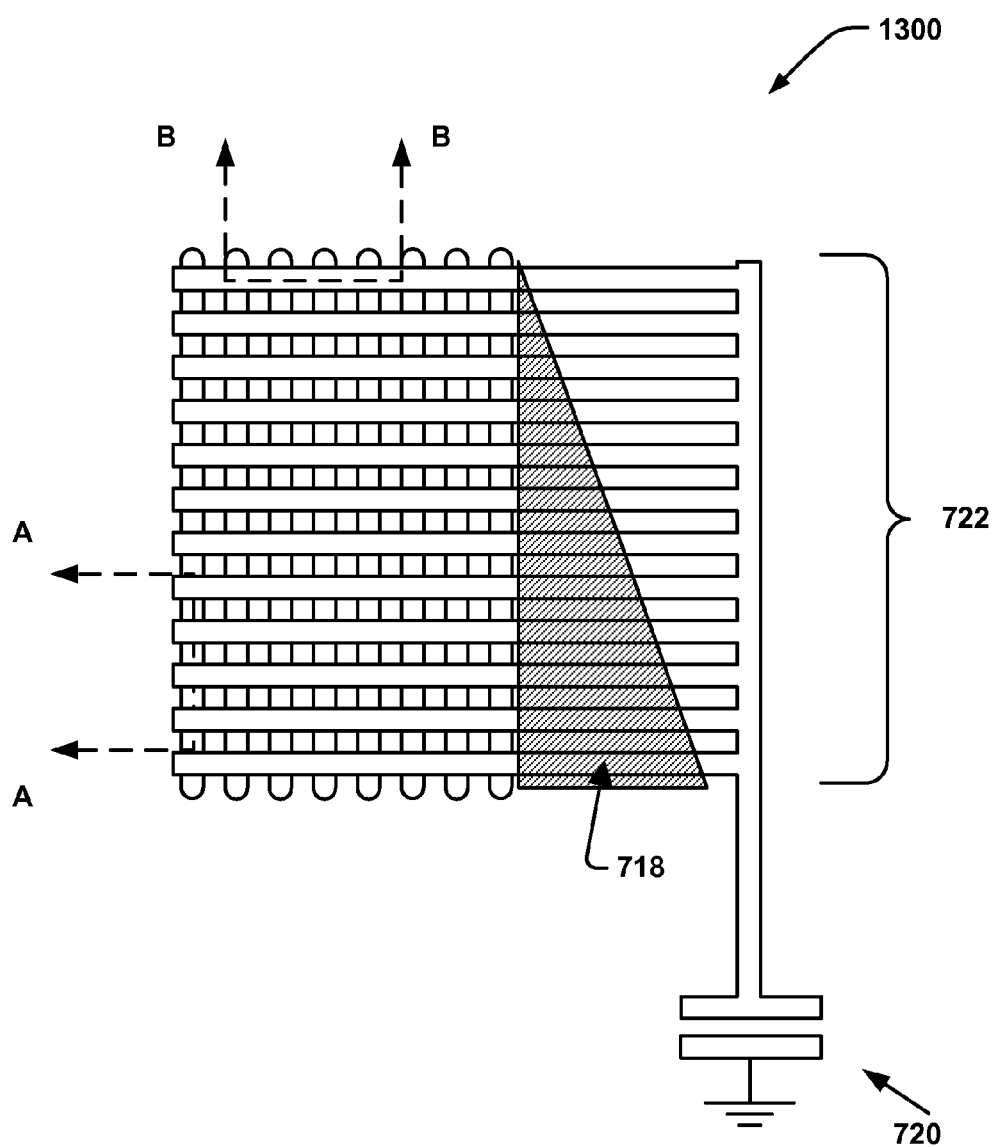

In FIG. 30, one example of the present invention 1300, a triangular shaped salicide block 718 is formed in order to vary the amount of salicide blocking material 688 overlying each wordline. The present inventors appreciate that by varying the amount of salicide blocking material 688 on each wordline 678 the resistance relative to the total resistance of each wordline path to a common discharge region 720 may be made uniform. A variety of shapes and/or wedges may be utilized in accordance with the scope of the present invention to equalize the resistance in an array. Further, the scope of the present invention is not limited to any particular shape of the salicided block region 718. Other shapes conducive for any desired resistance of a wordline path fall within the scope of the invention. Any shape of the salicide block 718 may be utilized by varying the measured angle of etching on each wordline or calculated so that the resistance matches each wordline path from a wordline node to a common discharge element, such as a capacitor 720 for example. A patterned discharge element 720, such as a capacitor is patterned in accordance with one aspect of the present invention with a common shorting element 722 connecting a portion of a plurality of wordlines, as depicted in the cross-section A-A, on top of a plurality of bitlines, as depicted in the cross-section B-B.

Figure 31:
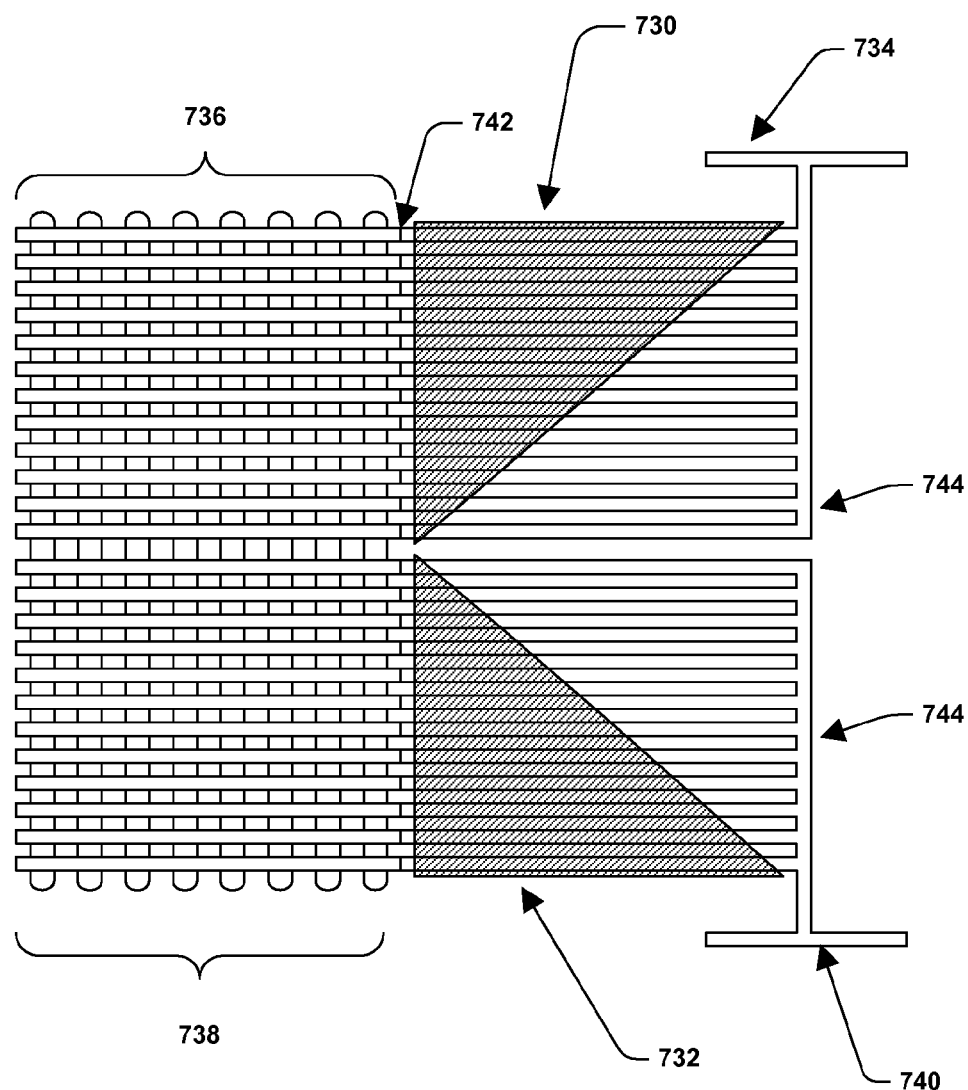

FIG. 31 depicts an aspect of the present invention and only one embodiment of various arrangements within the scope of the invention as a bow-tie arrangement of more than one variable salicide block 730, 732 within an array. Each sector in an array of typically 256 wordlines contains two common charge dissipation elements, one element 734 for a top portion of wordlines 736 and another 740 for a bottom portion of wordlines 738 in a sector. Each common element 734, 740 dissipates any charge-up of a top or bottom portion of the array during processing or various etchings. Each wordline path from a wordline node 742 to a common shorting element 744 of a common discharge element 734, 740 overlies a salicide block region 730, 732 shaped for various resistance paths wherein a top salicide block 730 is a downward triangular shape tapering inward to the center and a bottom salicide block 732 is an upward triangular shape tapering inward to the center in a bow-tie formation. One embodiment of the present invention includes a salicide block 730, 732 that is a wedge or a triangular shape. Other shapes conducive for any desired resistance path fall within the scope of the invention. Any shape of the salicide block 730, 732 may be utilized by varying the measured angle of etching on each wordline 736, 738 or calculated so that the resistance matches each wordline path to a common discharge element 734, 740.

Figure 32:
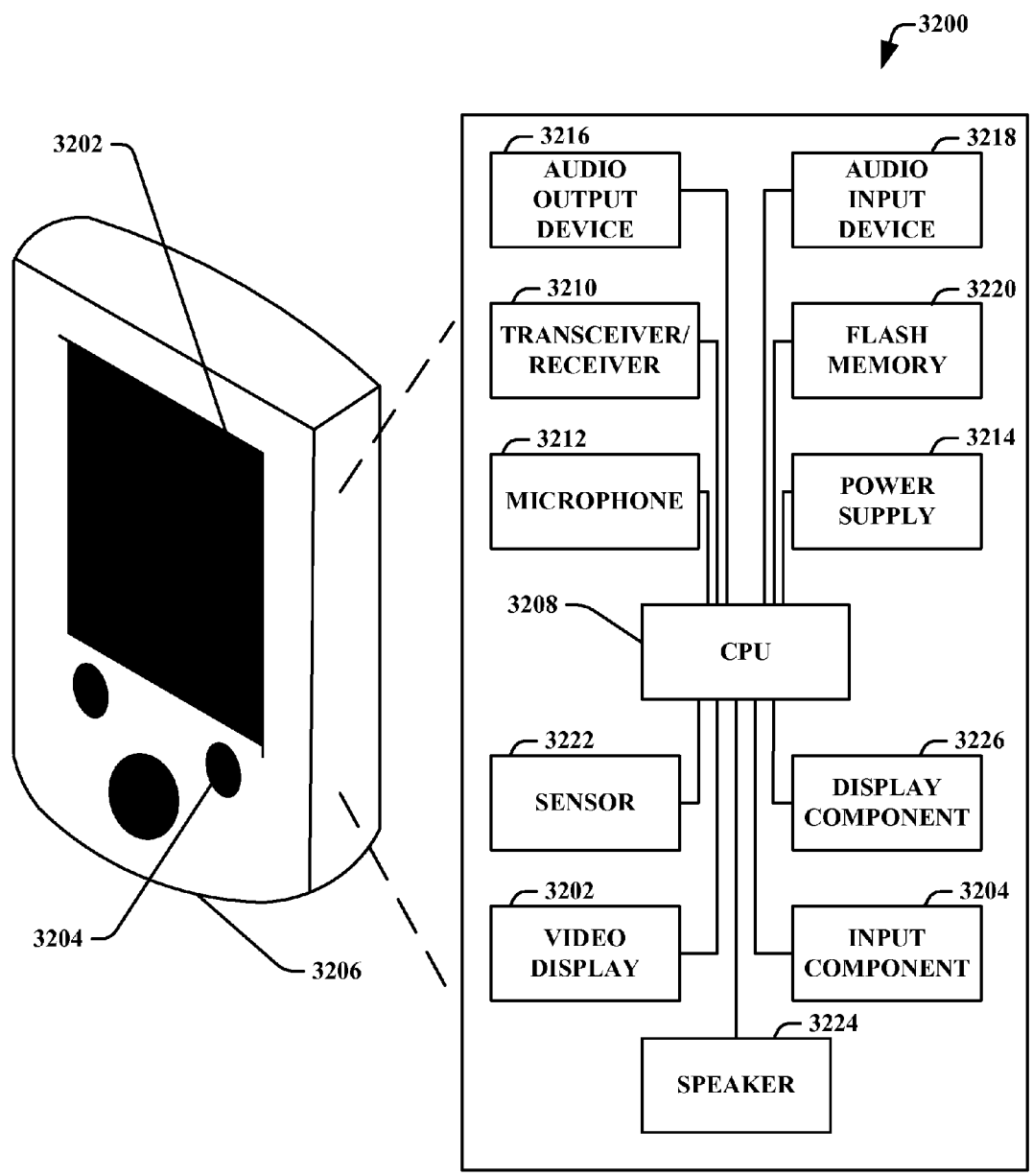
FIG. 32 is an isometric view of a device and block diagram according to yet one or more aspects of the present invention.

FIG. 32 is an exemplary portable electronic device, for example, a Personal Data Assistant (PDA) 3200 comprising a video display 3202, an input component 3204, a housing 3206, a CPU 3208, a transceiver and/or a receiver 3210, a microphone 3212, a power supply 3214, an audio output device 3216, an audio input 3218, flash memory 3220, various sensors 3222, and speaker(s) 3224. The flash memory 3220 utilizing dual bit and single bit memory devices manufactured with improved reliability to a commonly joined element by a variable salicide block equilibrating the resistance in an array, per the present invention. The audio input device 3218 can be a transducer, for example. The input component 3204 can include a keypad, buttons, dials, pressure keys, and the like. The video display 3202 can be a liquid crystal display, a plasma display, an LED display, and the like, for displaying visual data and information. In accordance with another embodiment of the claimed subject matter, the portable device with flash memory 3220 manufactured according to the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 3220 can include random access memory, read only memory, optical memory, audio memory, magnetic memory, and the like.

According to one embodiment of the present invention, the CPU 3208 is configured to communicate with the audio input device 3218, the audio output device 3216 and a display component 3226. The display component 3226 can be separate and distinct from the video display 3202. The CPU 3208 can execute control functions based on inputs from the user, entered using the input component 3204, for example. Based on those inputs, for example the display component can display a graph, a photo, a map, a chart, a video, and the like. The PDA 3200 is also configured to output data as an audio signal, for example a song, a message, a warning sound, various tones, recordings, etc. In another embodiment of the present invention the PDA 3200 can communicate with other electronic devices, for example computers, cell phones, other PDAs, and the like. The PDA 3200 is also configured to transmit digital data wirelessly from one user to another. This is done utilizing the transmitter/receiver 3210 to either transmit or receive data. Additionally, sensors 3222 can be utilized to sense data external to the PDA 3200, for example, temperatures, radiation levels, pressures, and the like.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating at least a portion of a memory array comprising:
    forming a charge trapping dielectric layer;
    forming a plurality of bitlines, the plurality of bitlines configured to operate as acting sources and acting drains;
    forming a plurality of wordlines electrically coupled to a common discharge node, wherein the charge trapping dielectric layer is dis nosed between one or more of the plurality of bitlines and one or more of the plurality of wordlines; and
    processing the plurality of wordlines to substantially equalize a resistance between each of the wordlines and the common discharge node.

2. The method of claim 1, wherein equalizing the resistance between each of the wordlines and the common discharge node comprises:
    determining a calculated resistance between respective wordlines and the common discharge node, wherein the calculated resistance is a function of an amount of desired charge dissipation into the common discharge node; and
    forming a salicide blocking material disposed between respective wordlines and the common discharge node, the salicide blocking material configured to provide the equalized resistance based upon the calculated resistance.

3. The method of claim 1, wherein equalizing the resistance between each of the wordlines and the common discharge node comprises:

depositing a layer of salicide blocking material on the plurality of word lines;

masking at least a portion of the salicide blocking material;

selectively etching the unmasked portion of the salicide blocking material to form an exposed region over a portion of the plurality of wordlines; and forming a salicide on the exposed region of the plurality of the wordlines.

4. The method of claim 3, wherein processing the plurality of wordlines comprises:

patterning the salicide blocking material to selectively vary the resistance between each word line and the common discharge node for resistance equalization of each respective wordline.

5. The method of claim 3, wherein the salicide blocking material is patterned into a triangular wedge shape extending across the plurality of wordlines and oriented to block salicide formation along each respective wordline for a length inversely proportional to a distance from the common discharge element, thereby selectively equalizing the resistance between each wordline and the common discharge node.

6. The method of claim 1, wherein the common discharge node comprises at least one capacitor electrode of a capacitor element.

7. The method of claim 1, wherein the resistance of each respective word line to the common discharge node is at least about 1 Mega-Ohm.

8. The method of claim 6, wherein the capacitor element comprises a metal-oxide-semiconductor (MOS) capacitor formed by a method comprising:

forming a conductive well in a semiconductor substrate, wherein the conductive well comprises a first capacitor electrode;

forming an insulating layer disposed above at least a portion of the conductive well; and forming a conductive layer disposed above the insulating layer, wherein the conductive layer comprises a second capacitor electrode.

9. The method of claim 8, wherein the conductive layer comprises silicon dioxide.

10. The method of claim 1, wherein the charge trapping layer comprises a gate oxide material.

11. A method of fabricating at least a portion of a memory array comprising:

calculating a desired resistance as a function of an amount of desired charge dissipation into at least one charge dissipating region;

forming a charge trapping dielectric layer on a semiconductor substrate;

performing a bitline implant to form a plurality of bitlines in the semiconductor substrate, wherein the plurality of bitlines are configured to operate as acting sources and acting drains for dual bit operation;

depositing a conductive material over the charge trapping dielectric layer;

selectively patterning the deposited conductive material to form a plurality of wordlines that are each respectively connected to a common shorting element coupled to the at least one charge dissipating region; and forming at least one salicide blocking layer configured to selectively form salicided interfaces on a portion of the respective wordlines, the salicided interfaces providing a resistance between each respective word line and the common shorting element based on the calculated desired resistance.

12. The method of claim 11, wherein the salicided interfaces of each wordline have different surface areas, thereby substantially equalizing the resistance between the plurality of wordlines and the at least one common charge dissipating region.

13. The method of claim 11, further comprising:

forming a top salicide blocking layer extending across a top subset of the plurality of wordlines, the top salicide blocking layer configured to block salicide formation along respective word lines in the top subset for a length inversely proportional to a distance from a first common discharge element, thereby selectively equalizing the resistance between each wordline in the top subset and the first common discharge element; and forming a bottom salicide blocking layer extending across bottom subset of the plurality of wordlines, the bottom salicide blocking layer configured to block salicide formation along respective wordlines in the bottom subset for a length inversely proportional to a distance from a second common discharge element, thereby selectively equalizing the resistance between each word line in the bottom subset and the second common discharge element.

14. The method of claim 13, wherein the top and bottom salicide blocking layers are configured into a bow-tie formation.

15. The method of claim 12, wherein forming at least one salicide blocking layer comprises:

depositing a salicide blocking material over the plurality of wordlines;

masking a portion of the salicide blocking material;

selectively patterning the salicide blocking material to form an exposed region over a portion of the plurality of wordlines; and forming a salicide blocking layer on the exposed region of the plurality of wordlines.

16. The method of claim 12, wherein the resistance between each respective wordline and the common charge dissipating region is at least about 1 Mega-Ohm.

* * * * *

UNITED STATES PATENT AND TRADEMARK OFFICE
CERTIFICATE OF CORRECTION

PATENT NO. : 7,713,875 B2 Page 1 of 1
APPLICATION NO. : 11/748215
DATED : May 11, 2010
INVENTOR(S) : Michael Brennan et al.

It is certified that error appears in the above-identified patent and that said Letters Patent is hereby corrected as shown below:

Column 18, claim 1, line 46; please replace "dis nosed" with --disposed--

Signed and Sealed this

Fifteenth Day of June, 2010

David J. Kappos
*Director of the United States Patent and Trademark Office*